United States Patent
Kobayashi

(10) Patent No.: US 8,692,626 B2
(45) Date of Patent: Apr. 8, 2014

(54) OSCILLATION DEVICE

(75) Inventor: Kaoru Kobayashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/568,129

(22) Filed: Aug. 7, 2012

(65) Prior Publication Data
US 2013/0038397 A1    Feb. 14, 2013

(30) Foreign Application Priority Data
Aug. 8, 2011  (JP) .................. 2011-173182

(51) Int. Cl.
*H03B 5/30*    (2006.01)

(52) U.S. Cl.
USPC .............. 331/158; 331/2; 331/46; 331/116 R; 331/116 FE; 331/176

(58) Field of Classification Search
USPC .............. 331/2, 46, 158, 116 R, 116 FE, 176
See application file for complete search history.

(56) References Cited

U.S. PATENT DOCUMENTS

| 5,214,668 A * | 5/1993 | Satou et al. ............... 374/117 |
| 7,541,878 B2 * | 6/2009 | Haiut .......................... 331/2 |
| 8,536,952 B2 * | 9/2013 | Akaike et al. ............. 331/158 |

FOREIGN PATENT DOCUMENTS

| JP | 2001-292030 | 10/2001 |
| JP | 4989743 | 5/2012 |
| JP | 2012-170050 | 9/2012 |
| JP | 2012-195932 | 10/2012 |

\* cited by examiner

*Primary Examiner* — Arnold Kinkead
(74) *Attorney, Agent, or Firm* — Jianq Chyun IP Office

(57) ABSTRACT

An oscillation device for reducing memory capacity includes a frequency difference detecting unit and a compensation value obtaining unit. When oscillation frequencies of the first and second oscillation circuits are respectively f1 and f2, and oscillation frequencies of the first and second oscillation circuits at a reference temperature are respectively f1$r$ and f2$r$, the frequency difference detecting unit determines a difference corresponding value x corresponding to a difference value between a value corresponding to a difference between f1 and f1$r$, and a value corresponding to a difference between f2 and f2$r$. The compensation value obtaining unit obtains a frequency compensation value of f1 resulting from ambient temperature different from reference temperature based on the difference corresponding value x, and calculates the frequency compensation value of f1 by calculating $n^{th}$-order polynomial for X being a value corresponding to x/k, where k is a divide coefficient specific to a device.

2 Claims, 19 Drawing Sheets

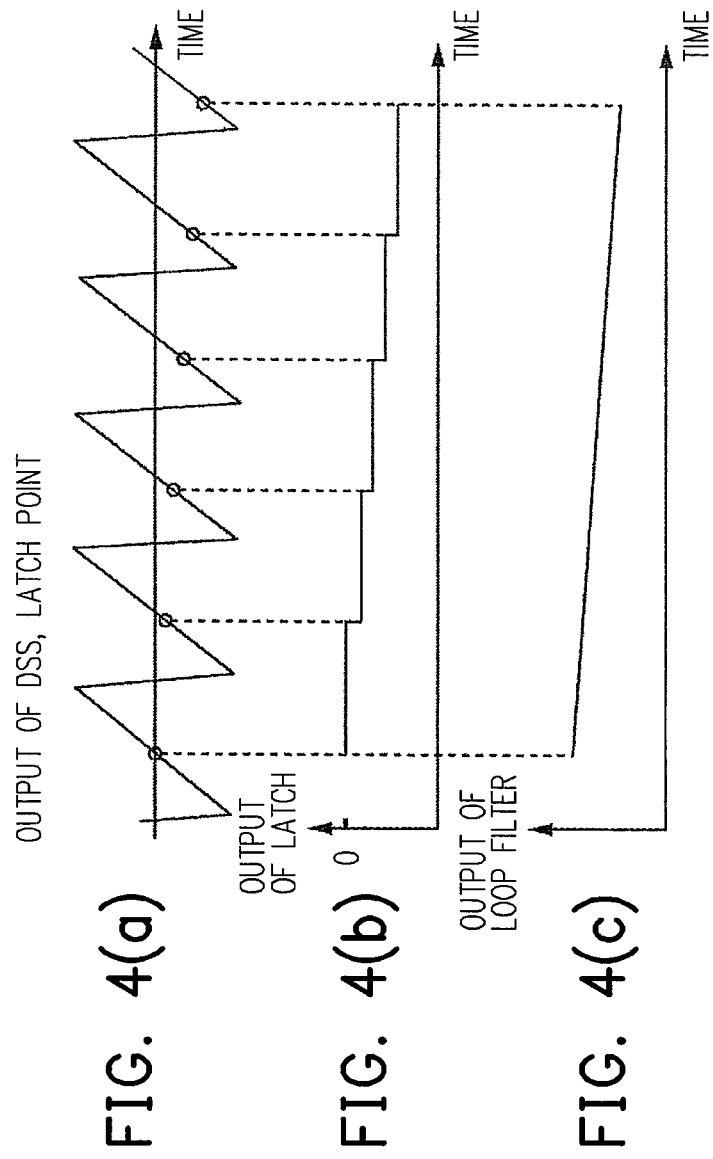

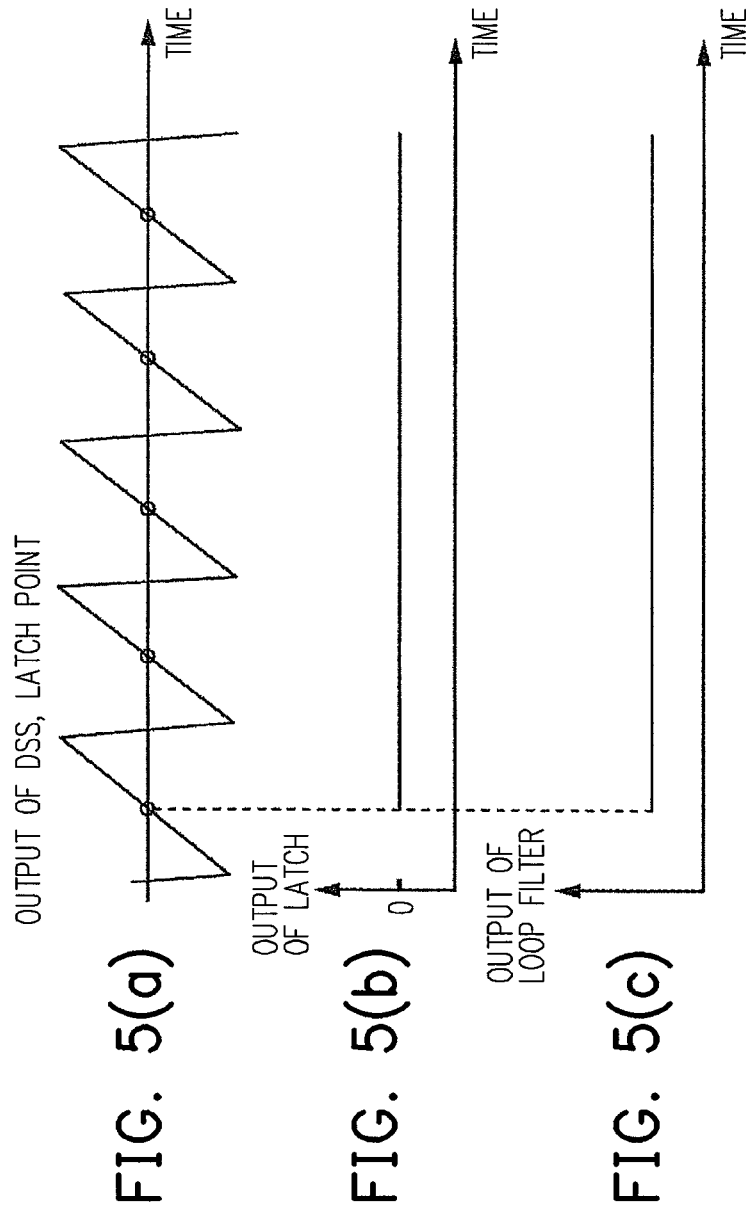

OSCILLATION DEVICE

CROSS-REFERENCE TO RELATED APPLICATION

This application claims the priority benefit of Japan application serial no. 2011-173182, filed on Aug. 8, 2011. The entirety of the above-mentioned patent application is hereby incorporated by reference herein and made a part of specification.

BACKGROUND OF THE INVENTION

1. Field of the Invention

The present invention relates to an oscillation device for detecting a temperature at which a quartz-crystal oscillator is placed, and for conducting temperature compensation of an output frequency based on a result of the temperature detection.

2. Description of the Related Art

Normally, when a quartz-crystal oscillator is incorporated in an application to which quite high frequency stability is required, an oven controlled Crystal Oscillator (OCXO) is generally used, but the OCXO is formed of a large-scale device, and thus has a large power consumption. For this reason, it is considered to use a Temperature compensated crystal oscillators (TCXO) with a simple structure and small power consumption, but the TCXO has a disadvantage that a frequency stability with respect to a temperature is inferior to that of the OCXO.

FIG. 19 shows a general structure of the TCXO. Reference numeral 90 denotes a quartz-crystal oscillator and reference numeral 91 denotes an oscillation circuit, and by changing a control voltage supplied from a control voltage generating unit 93 to a voltage variable capacitance element 92, a capacitance of the voltage variable capacitance element 92 is controlled to adjust an oscillation frequency (output frequency).

A frequency of the quartz-crystal oscillator 90 changes in accordance with a temperature, so that the control voltage generating unit 93 compensates the control voltage in accordance with a temperature detected by a temperature detector 94. Concretely, a cubic function, for example, being a function in which a frequency-temperature characteristic of the quartz-crystal oscillator 90 is normalized by a reference temperature is stored in a memory 95, and a frequency corresponding to a temperature detection value is read based on this function (frequency-temperature characteristic). Specifically, how much a frequency at a temperature at that time is deviated from a frequency at the reference temperature is read, and a control voltage corresponding to a deviation amount of the frequency is set as an amount of temperature compensation, and is subtracted from a control voltage corresponding to the frequency at the reference temperature.

However, when the temperature compensation control is tried to be finely conducted, an amount of data for specifying the function of the frequency-temperature characteristic becomes large, and a large-capacity memory is required as the memory 95, resulting in that the memory 95 becomes expensive. Further, a thermistor is normally used as the temperature detector, so that even when the amount of data is enlarged, an improvement in frequency accuracy cannot be expected due to a limit in detection accuracy of the temperature detector.

Further, since the temperature detector 94 and the quartz-crystal oscillator 90 are disposed at different positions, it is not possible to correctly obtain actual temperature information of the quartz-crystal oscillator 90, and from this point as well, the improvement in frequency accuracy cannot be expected.

In FIG. 2 and FIG. 3 of Patent Document 1, it is described to structure two quartz-crystal oscillators (quartz-crystal resonators) by providing two pairs of electrodes on a common quartz-crystal piece. Further, paragraph 0018 describes that a frequency difference appears between the two quartz-crystal oscillators in accordance with a temperature change, and measuring of this frequency difference is equivalent to measuring of temperature. Further, a relation between this frequency difference Δf and an amount of frequency to be compensated is stored in a ROM, and an amount of frequency compensation is read based on Δf.

However, as described in paragraph 0019, this method is required to adjust the quartz-crystal oscillators so that, regarding a desired output frequency f0 and respective frequencies f1, f2 of the two quartz-crystal oscillators, a relation of f0≈f1≈f2 is satisfied, and thus there are problems that a manufacturing process of the quartz-crystal oscillators becomes complicated, and besides, it is not possible to achieve high yield. Furthermore, as shown in FIG. 4 of Patent Document 1, clocks being frequency signals from the respective quartz-crystal oscillators are counted for a given period of time, and a difference between the clocks (f1−f2) is determined, so that a detection accuracy directly influences on a detection time, which makes it difficult to realize high-accuracy temperature compensation.

[Patent Document 1] Japanese Patent Application Laid-open No. 2001-292030

SUMMARY OF THE INVENTION

The present invention has been made under such circumstances, and is to provide technologies for reducing, in an oscillation device, an amount of data which specifies a function for compensating a variation of an oscillation frequency resulting from a difference between a reference temperature and an ambient temperature, and thereby a memory capacity for storing the aforementioned data can be reduced.

The present invention is directed to an oscillation device, compensating a setting signal for setting an output frequency based on a detection result of an ambient temperature. The oscillation device comprises a first quartz-crystal oscillator, structured by providing first electrodes on a quartz-crystal piece; a second quartz-crystal oscillator, structured by providing second electrodes on a quartz-crystal piece; a first oscillation circuit and a second oscillation circuit, connected to the first quartz-crystal oscillator and the second quartz-crystal oscillator respectively; a frequency difference detecting unit, when an oscillation frequency of the first oscillation circuit is set to f1, an oscillation frequency of the first oscillation circuit at a reference temperature is set to f1r, an oscillation frequency of the second oscillation circuit is set to f2, and an oscillation frequency of the second oscillation circuit at the reference temperature is set to f2r, the frequency difference detecting unit determines a difference corresponding value x which is corresponding to a difference value between a value corresponding to a difference between f1 and f1r, and a value corresponding to a difference between f2 and f2r; and a compensation value obtaining unit, obtaining a frequency compensation value of f1 resulting from the ambient temperature being different from the reference temperature based on the difference corresponding value x detected in the frequency difference detection unit. Wherein, the compensation value obtaining unit is structured to include a function for calculating the frequency compensation value of f1 for X, and X is a value corresponding to x/k by calculating an $n^{th}$-order polynomial, n is not less than 4, where k is a divide coefficient specific to a device introduced in order to set a coefficient of the polynomial to small value; the divide coefficient k is a value previously set according to a maximum value of the difference corresponding value x previously detected in a measurement temperature range; an output of the oscillation device is structured to be generated by utilizing an output of the first oscillation circuit; and the setting signal is structured to be compensated based on the frequency compensation value determined by the compensation value obtaining unit.

The compensation value obtaining unit may comprises a multiplication section; a division section, dividing an output from the multiplication section by the divide coefficient k; an integration section, integrating an output from the division section one by one to the constant of the polynomial; a first switching section, switching between the difference corresponding value x and the output from the division section to be output to the multiplication section; and a second switching section, switching between the difference corresponding value x and the coefficient in each order of the polynomial to be output to the multiplication section. Wherein, the compensation value obtaining unit is structured to multiply the values from both switching sections by the switching of the first switching section and the second switching section, and to output a calculated value of the polynomial from an adding section.

In the present invention, the oscillation device compensates the output frequency based on the detection result of an ambient temperature, and there is provided the compensation value obtaining unit obtaining, when oscillation frequencies of the first and second oscillation circuits are respectively set to f1 and f2, and oscillation frequencies of the first and second oscillation circuits at the reference temperature are respectively set to f1r and f2r, the frequency compensation value of f1 resulting from the ambient temperature being different from the reference temperature based on the value x in which the difference corresponding value obtained from the f1, f2, f1r, and f2r is normalized by the maximum value set up previously. The compensation value obtaining unit is structured to include a function for calculating the frequency compensation value of f1 by calculating an $n^{th}$-order polynomial for X being a value corresponding to x/k, where k is a divide coefficient set previously. Accordingly, the absolute value of the coefficient of the polynomial can be made small, and thereby the memory capacity required for storing this coefficient can be reduced.

BRIEF DESCRIPTION OF THE DRAWINGS

FIGS. 4(a), 4(b) and 4(c) are waveform diagrams of respective sections schematically showing an unlocked state in a loop including a DDS circuit section shown in FIG. 2;

FIGS. 5(a), 5(b) and 5(c) are waveform diagrams of the respective sections schematically showing a locked state in the loop including the DDS circuit section shown in FIG. 2;

DETAILED DESCRIPTION OF THE PREFERRED EMBODIMENT(S)

Figure 1:
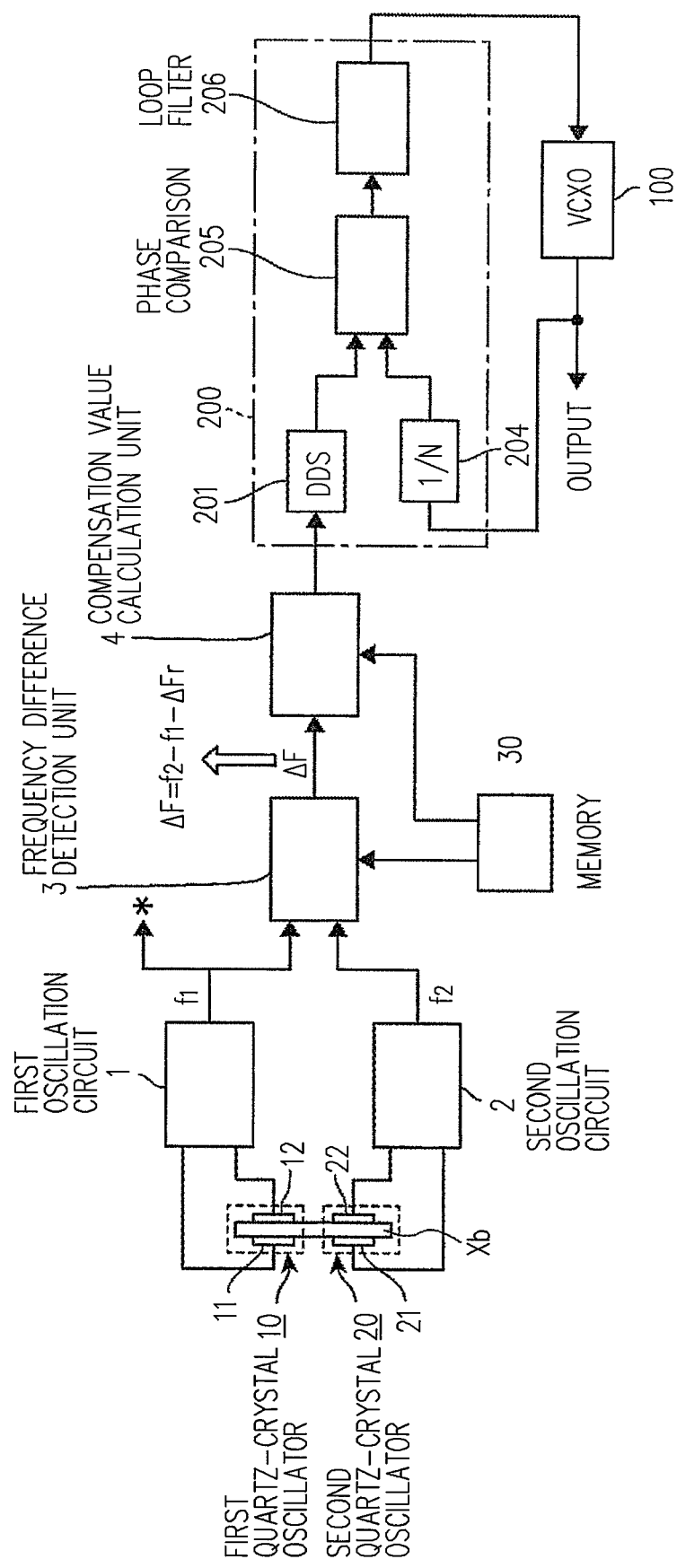
FIG. 1 is a block diagram showing an entire structure of an embodiment of the present invention.

FIG. 1 is a block diagram showing an entire embodiment of an oscillation device of the present invention. This oscillation device is structured as a frequency synthesizer that outputs a frequency signal of a set frequency. The oscillation device includes a voltage controlled oscillator 100 using a quartz-crystal oscillator; a control circuit unit 200 that structures a PLL (Phase locked loop) in the voltage controlled oscillator 100; and a temperature compensation unit that performs temperature compensation of reference clock input into the control circuit unit 200. Although a reference numeral is not given to the temperature compensation unit, the temperature compensation unit corresponds to a part on the left side of the control circuit unit 200 in FIG. 1.

This control circuit unit 200 compares "a phase of reference (for reference) clock output from a Direct Digital Synthesizer (DDS) circuit section 201" with "a phase of clock as a result of frequency-dividing an output of the voltage controlled oscillator 100 with a frequency divider 204" in a phase frequency comparing unit 205. Further, a phase difference being a result of the comparison is analog-converted by a charge pump provided on a subsequent stage of the phase frequency comparing unit 205 (not shown). The analog-converted signal is input into a loop filter 206 and controlled, so that a PLL (Phase locked loop) is stabilized. Therefore, it is also possible to say that the control circuit unit 200 is a PLL unit. Here, the DDS circuit section 201 uses a frequency signal output from a later-described first oscillation circuit 1 as the reference clock, and frequency data (digital value) for outputting a signal of intended frequency is input therein.

However, a frequency of the reference clock has a temperature characteristic, so that in order to cancel the temperature characteristic, a signal corresponding to a later-described frequency compensation value is added to the frequency data which is input into the DDS circuit section 201. Although briefly described about this structure in FIG. 1, the output frequency of the DDS circuit section 201, corresponding to an amount of temperature variation based on an amount of variation in the temperature characteristic of the reference clock, is cancelled by compensating the frequency data input into the DDS circuit section 201, and resulting in that a frequency of reference clock is stabilized with respect to the temperature variation. Accordingly, an output frequency from the voltage controlled oscillator 100 is stabilized.

The temperature compensation unit includes a first quartz-crystal oscillator 10 and a second quartz-crystal oscillator 20. The first quartz-crystal oscillator 10 and the second quartz-crystal oscillator 20 are structured by using a common quartz-crystal piece Xb. Specifically, for example, an area of the quartz-crystal piece Xb with a strip shape is divided into two divided areas in a longitudinal direction, and excitation electrodes are provided on both front and rear surfaces of the respective divided areas (oscillation areas). Therefore, one divided area and a pair of electrodes 11, 12 form the first quartz-crystal oscillator 10, and the other divided area and a pair of electrodes 21, 22 form the second quartz-crystal oscillator 20. For this reason, it can be said that the first quartz-crystal oscillator 10 and the second quartz-crystal oscillator 20 are thermally coupled.

To the first quartz-crystal oscillator 10 and the second quartz-crystal oscillator 20, a first oscillation circuit 1 and a second oscillation circuit 2 are respectively connected. Each of outputs of these oscillation circuits 1, 2 may be an overtone (harmonic) of each of the quartz-crystal oscillators 10, 20, or may also be a fundamental wave of each of the oscillators, for example. When the output of overtone is obtained, it is also possible to design such that a tuning circuit for overtone is provided in an oscillation loop formed of a quartz-crystal oscillator and an amplifier, for example, and the oscillation loop is oscillated by the overtone. Alternatively, the oscillation loop is oscillated by the fundamental wave, and a class C amplifier is provided in a subsequent stage of an oscillation stage (e.g., a subsequent stage of a power amplifier which is a part of Colpitts circuit). The fundamental wave may be distorted with this class C amplifier, and a tuning circuit tuning with the overtone may be provided in a subsequent stage of the class C amplifier, resulting in that a third overtone oscillation frequency may be output from each the oscillation circuit 1 and 2.

Here, for convenience, if it is set such that a frequency signal of a frequency f1 is output from the first oscillation circuit 1, and a frequency signal of a frequency f2 is output from the second oscillation circuit 2, the frequency signal of the frequency f1 is supplied to the control circuit unit 200 as a reference clock. Reference numeral 3 denotes a frequency difference detecting unit, and, schematically speaking, this frequency difference detecting unit 3 is a circuit unit for obtaining $\Delta F = f2 - f1 - \Delta fr$, which is a difference between "a difference between f1 and f2" and $\Delta fr$. $\Delta fr$ is a difference between f1 and f2 at a reference temperature, which is, for example, 25° C. The difference between f1 and f2 is, for example, several MHz, as an example. The present invention is realized by calculating, with the use of the frequency difference detecting unit 3, $\Delta F$ being a difference between "a value corresponding to the difference between f1 and f2" and "a value corresponding to the difference between f1 and f2 at the reference temperature (for example, 25° C.)". In a case of this embodiment, more specifically speaking, a value obtained by the frequency difference detecting unit 3 is $\{(f2-f1)/f1\} - \{(f2r-f1r)/f1r\}$. However, a display of an output of the frequency difference detecting unit 3 is briefly described in the drawing.

Figure 2:
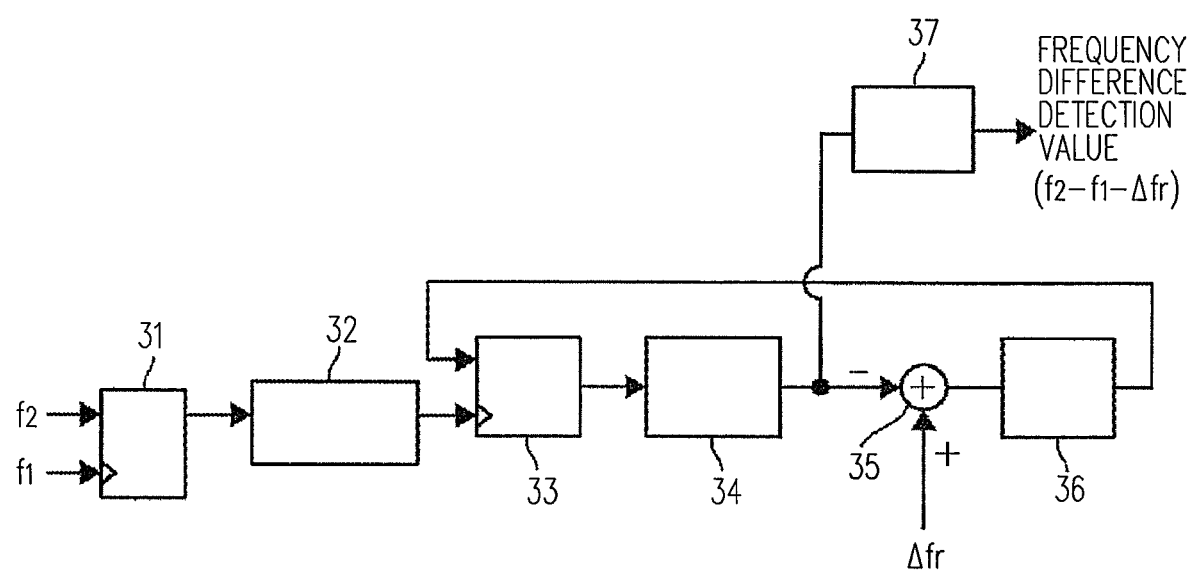
FIG. 2 is a block diagram showing a part of the embodiment of the present invention.

FIG. 2 shows a concrete example of the frequency difference detecting unit 3. Reference numeral 31 denotes a flip-flop circuit (F/F circuit). The frequency signal of the frequency f1 from the first oscillation circuit 1 is input into one input end of the flip-flop circuit 31, and the frequency signal of the frequency f2 from the second oscillation circuit 2 is input into the other input end of the flip-flop circuit 31. The flip-flop circuit 31 latches the frequency signal of the frequency f2 from the second oscillation circuit 2 based on the frequency signal of the frequency f1 from the first oscillation circuit 1. In the description hereinbelow, to avoid the redundancy of description, f1, f2 are treated such that they represent frequencies or frequency signals themselves. From the flip-flop circuit 31, a signal having a frequency of $(f2-f1)/f1$, being the value corresponding to the frequency difference between f1 and f2 is output.

Figure 3:
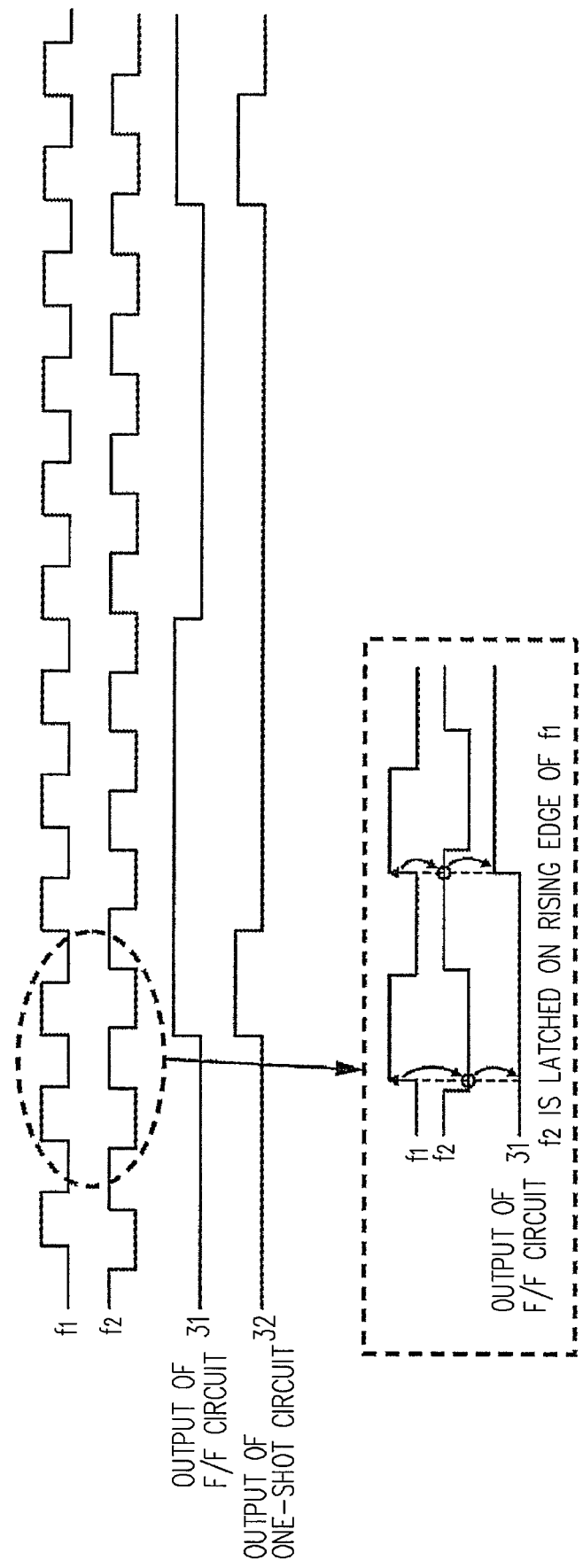
FIG. 3 is a waveform diagram of outputs of a part shown in FIG. 2.

A one-shot circuit 32 is provided at a subsequent stage of the flip-flop circuit 31, and the one-shot circuit 32 outputs a one-shot pulse at a rising edge of a pulse signal obtained from the flip-flop circuit 31. FIG. 3 are time diagrams showing a series of signals described so far.

At a subsequent stage of the one-shot circuit 32, a Phase Locked Loop (PLL) is provided, and the PLL is structured by a latch circuit 33, a loop filter 34 having an integrating function, an adding section 35 and a DDS circuit section 36. The latch circuit 33 is for latching a saw-tooth wave output from the DDS circuit section 36, based on the pulse output from the one-shot circuit 32, and an output of the latch circuit 33 corresponds to a signal level of the saw-tooth wave at a timing at which the pulse is output. The loop filter 34 integrates a direct-current voltage being the signal level, and the adding section 35 adds the direct-current voltage and a direct-current voltage corresponding to $\Delta fr$. Data corresponding to the direct-current voltage corresponding to $\Delta fr$ is stored in the memory 30 shown in FIG. 1.

In this example, regarding a sign in the adding section 35, "+" is given to an input side of the direct-current voltage corresponding to $\Delta fr$, and "−" is given to an input side of the output voltage of the loop filter 34. To the DDS circuit section 36, a direct-current voltage calculated by the adding section 35, namely, a voltage as a result of subtracting the output voltage of the loop filter 34 from the direct-current voltage corresponding to $\Delta fr$ is input, and a saw-tooth wave of a frequency in accordance with a value of the voltage is output from the DDS circuit section 36. For easier understanding of an operation of the PLL, states of outputs of the respective sections are quite schematically shown in FIGS. 4(a) to 4(c). At a time of starting the device, the direct-current voltage corresponding to $\Delta fr$ is input into the DDS circuit section 36 through the adding section 35, and, if $\Delta fr$ is 5 MHz, for example, a saw-tooth wave of a frequency in accordance with the frequency is output from the DDS circuit section 36.

The saw-tooth wave is latched by the latch circuit 33 based on a pulse of frequency corresponding to $(f2-f1)$. If $(f2-f1)$ is 6 MHz, for example, a period of the pulse for latch is shorter than that of the saw-tooth wave, so that a latch point of the saw-tooth wave is gradually lowered as shown in FIG. 4(a), and the output of the latch circuit 33 and the output of the loop filter 34 are gradually lowered on the −(minus) side as shown in FIGS. 4(b) and 4(c). Since the sign in the adding section 35 on the output side of the loop filter 34 is the direct-current voltage input into the DDS circuit section 36 from the adding section 35 increases. Accordingly, the frequency of the saw-tooth wave output from the DDS circuit section 36 becomes high, and when the direct-current voltage corresponding to 6 MHz is input into the DDS circuit section 36, the frequency of the saw-tooth wave becomes 6 MHz, and the PLL is locked as shown in FIGS. 5(a) to 5(c). The direct-current voltage output from the loop filter 34 at this time takes a value corresponding to Δfr−(f2−f1)=−1 MHz. Specifically, it can be said that an integral value of the loop filter 34 corresponds to an integral value of an amount of change of 1 MHz, when the frequency of the saw-tooth wave is changed from 5 MHz to 6 MHz.

Contrary to this example, when Δfr is 6 MHz, and (f2−f1) is 5 MHz, since the period of pulse for latch is longer than that of the saw-tooth wave, the latch point shown in FIG. 4(a) becomes gradually high, and in accordance with this, the output of the latch circuit 33 and the output of the loop filter 34 are also increased. Accordingly, since the value to be subtracted in the adding section 35 becomes large, the frequency of the saw-tooth wave is gradually lowered, and when the frequency soon reaches 5 MHz being the same frequency as that of (f2−f1), the PLL is locked. The direct-current voltage output from the loop filter 34 at this time takes a value corresponding to Δfr−(f2−f1)=1 MHz. Note that FIG. 6 show actual measured data, and in this example, the PLL is locked at a time t0.

Incidentally, as described above, the output of the frequency difference detecting unit 3, namely, an output of an averaging circuit 37 shown in FIG. 2 is actually a value that represents the value of $\{(f2-f1)/f1\}-\{(f2r-f1r)/f1r\}$ by a 34-bit digital value. If it is set that $(f1-f1r)/f1r=OSC1$ (a unit thereof is ppm or ppb), and $(f2-f2r)/f2r=OSC2$ (a unit thereof is ppm or ppb), a change in an aggregation of the value from the vicinity of −50° C. to the vicinity of 100° C. with respect to the temperature forms substantially the same curve as that of OSC2−OSC1. Therefore, the output of the frequency difference detecting unit 3 can be treated such that OSC2−OSC1=temperature data.

Further, since the operation of latching f2 based on f1 in the flip-flop 31 is asynchronous, there is a possibility that an indefinite interval such as metastable (a state in which, when input data is latched at an edge of clock, the input data has to be held for a given period of time before and after the edge at which the latch is performed, but the clock and the input data change at substantially the same time, so that an output becomes unstable) is generated, and thus an instantaneous error may be included in the output of the loop filter 34. In the aforementioned PLL, the output of the loop filter 34 is treated as the difference between Δfr and (f2−f1) being the value corresponding to the temperature, so that by providing the averaging circuit 37 that determines a moving average of the input value at a previously set time, on an output side of the loop filter 34, even if the instantaneous error is generated, the error is removed. By providing the averaging circuit 37, it is possible to obtain, conclusively, frequency deviation information corresponding to the amount of variation in temperature with high accuracy.

Figure 7:
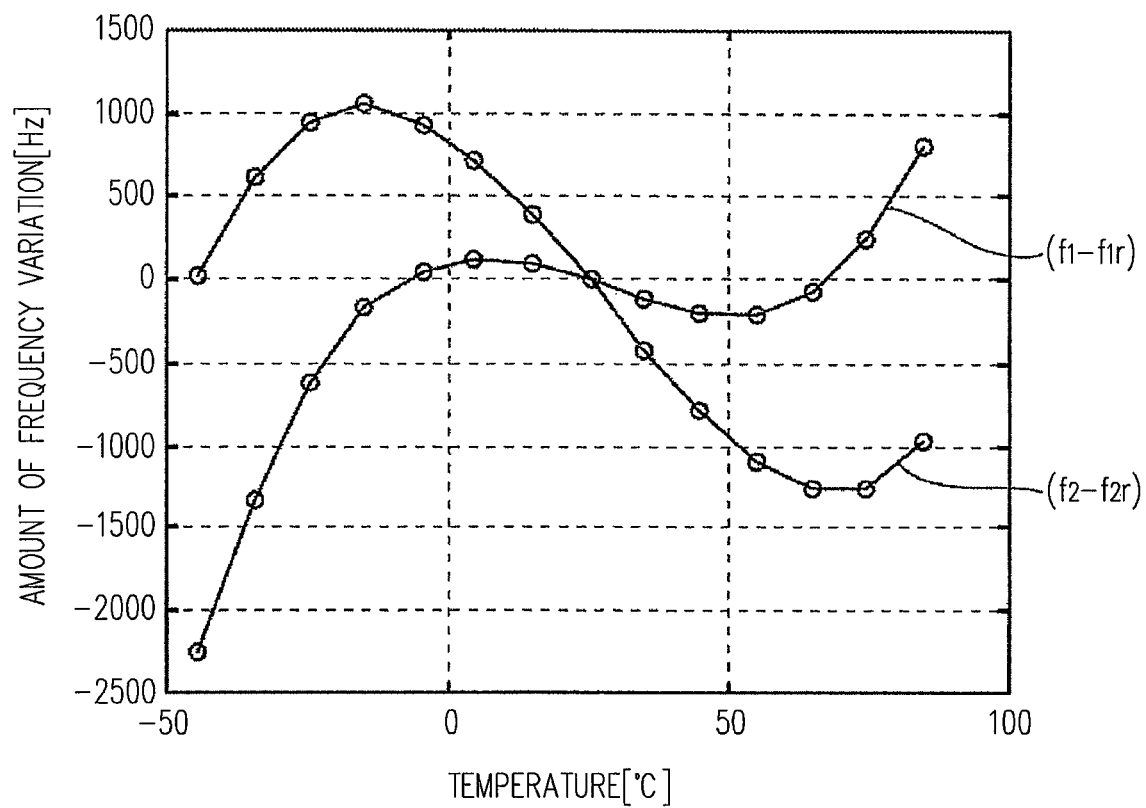
FIG. 7 is a frequency-temperature characteristic diagram showing relations between a frequency f1 of a first oscillation circuit and a temperature and between a frequency f2 of a second oscillation circuit and the temperature.

The frequency deviation information corresponding to the amount of variation in temperature obtained by the loop filter 34 of the PLL, which is Δfr−(f2−f1) in this example, is input into a compensation value calculating unit 4, which is a compensation value obtaining unit, shown in FIG. 1, in which a compensation value of frequency is calculated. Before making explanation on the compensation value calculating unit 4, the frequency deviation information and the frequency compensation value will be described with reference to FIG. 7 to FIG. 10. FIG. 7 is a characteristic diagram showing a relation between the temperature and the frequency after normalizing f1 and f2 using the reference temperature. The normalization described therein means to determine a relation between a deviation amount of frequency with respect to a frequency at a reference temperature and the temperature, by setting 25° C. to the reference temperature, for example, and setting, regarding the relation between the temperature and the frequency, the frequency at the reference temperature to zero. If the frequency at 25° C. in the first oscillation circuit 1 is set to f1r, and the frequency at 25° C. in the second oscillation circuit 2 is set to f2r, namely, if the values of f1, f2 at 25° C. are set to f1r, f2r, respectively, values on a vertical axis in FIG. 7 represent (f1−f1r) and (f2−f2r).

Figure 8:
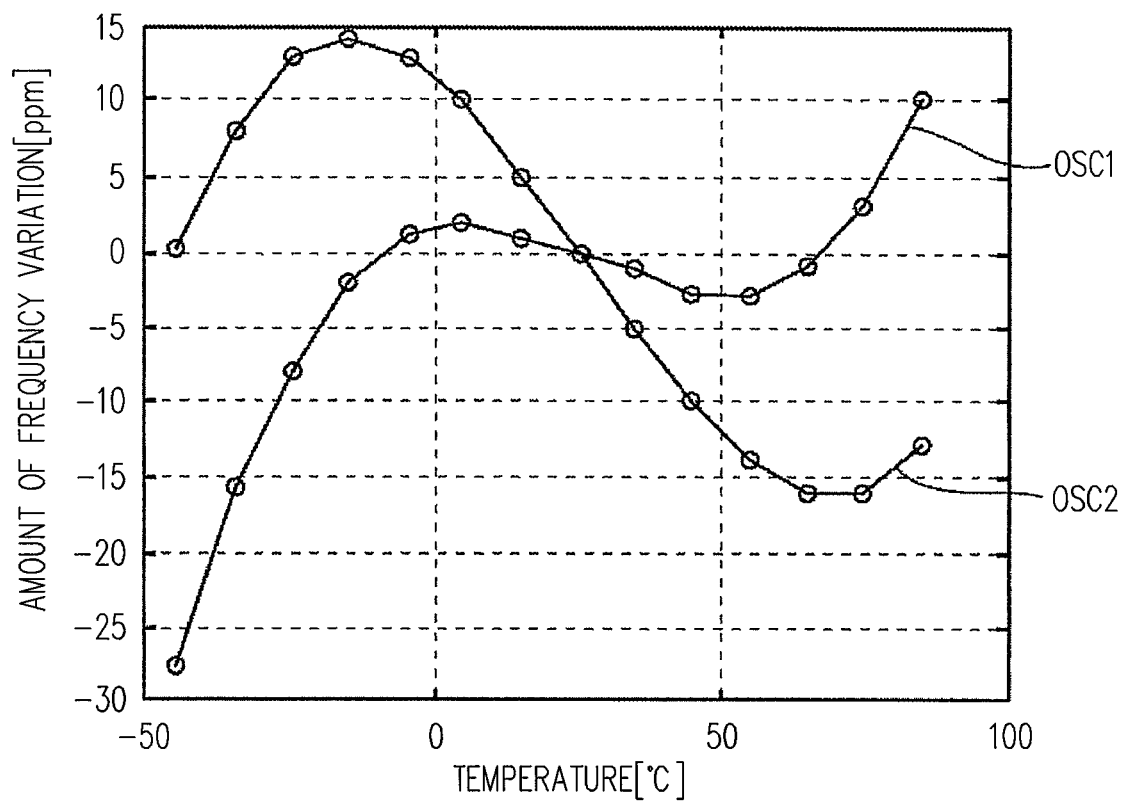
FIG. 8 is a frequency-temperature characteristic diagram showing relations between a value of normalized f1 and the temperature and between a value of normalized f2 and the temperature.

Further, FIG. 8 represents a rate of change of the frequency at each temperature shown in FIG. 7 with respect to the frequency at the reference temperature (25°C.). Therefore, values on a vertical axis in FIG. 8 represent (f1−f1r)/f1r and (f2−f1r)/f2r, and these values are set to be represented by OSC1 and OSC2, respectively. Note that, a unit of the value on the vertical axis in FIG. 8 is ppm.

Figures 6A, 6B:
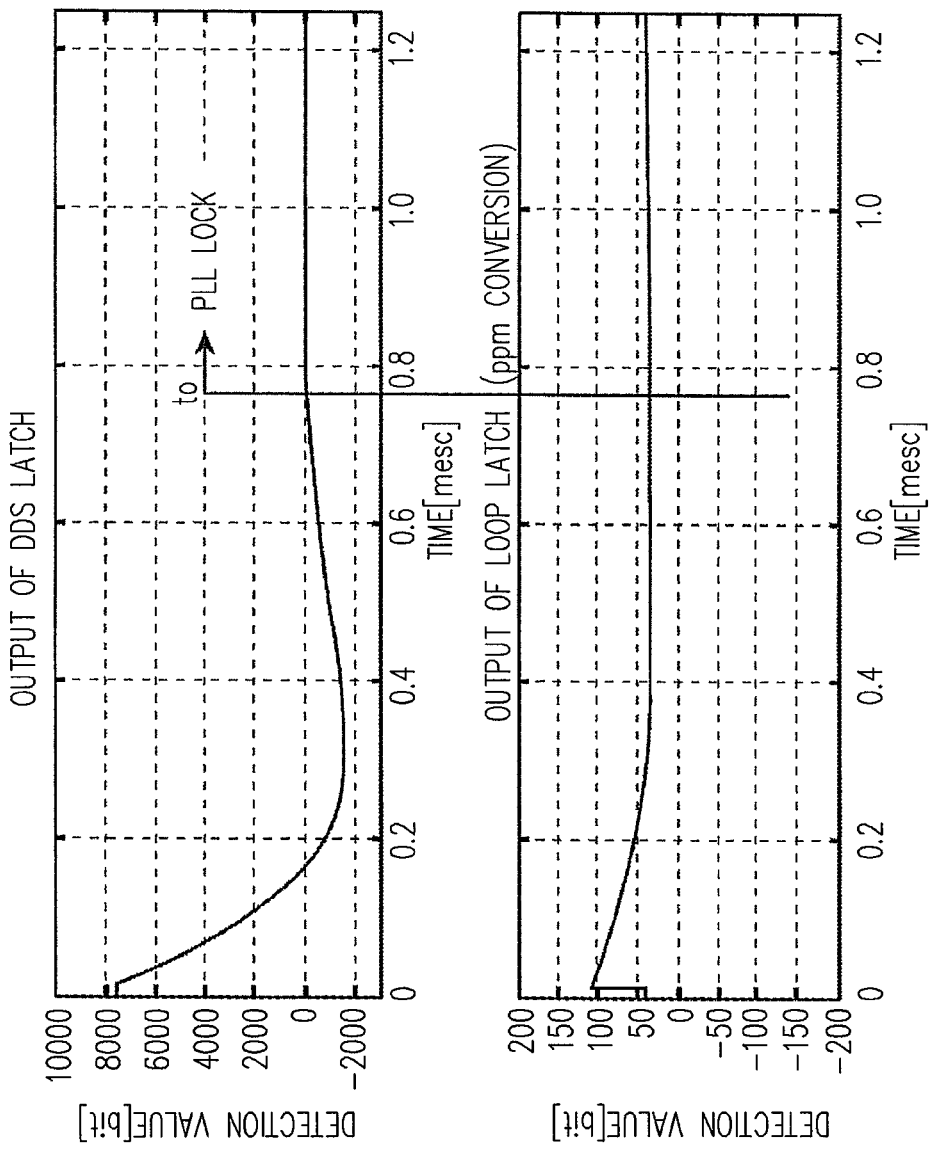
FIGS. 6(a) and 6(b) are waveform diagrams of the respective sections in the loop in an actual device corresponding to the aforementioned embodiment.

Here, returning to the explanation of the frequency difference detecting unit 3, the frequency difference detecting unit 3 in this embodiment performs calculation for determining OSC2−OSC1, not the value of (f2−f2r)−(f1−f1r)=f2−f1−Δfr itself, as described above. Specifically, the frequency difference detecting unit 3 determines, regarding a value of ratio indicating that each frequency is deviated from the frequency at the reference temperature at how much ratio, a difference between the ratio in f2 and the ratio in f1. The frequency signal corresponding to (f2−f1) is input into the latch circuit 33, but the saw-tooth wave is input into the PLL loop, so that it is possible to configure the circuit to conduct such calculation. If the output of the frequency difference detecting unit 3 is the 34-bit digital value, a value of 0.058 (ppb) per 1 bit is assigned, for example, and the value of OSC2−OSC1 achieves an accuracy as much as 0.058 (ppb). Note that, grounds why it is possible to set the value of 0.058 (ppb) per 1 bit are based on later-described expressions (2) to (4). When the explanation of FIGS. 6(a) and 6(b) is made at this stage, FIGS. 6(a) and 6(b) represent output values of the latch circuit 33 and the loop filter 34 incorporated in an actual circuit when OSC2−OSC1 being the frequency difference between f1 and f2 (accurately, the difference in the rates of change of the frequencies) is 40 ppm.

Figure 9:
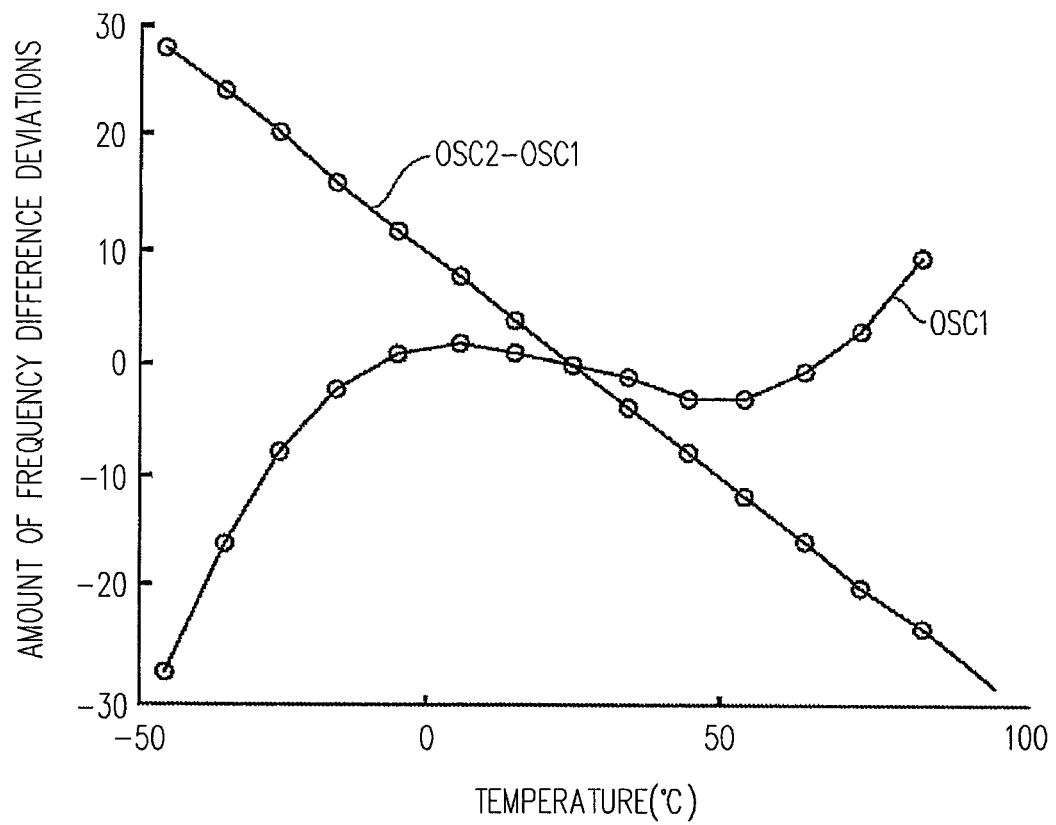
FIG. 9 is a frequency-temperature characteristic diagram showing a relation between the value of normalized f1 and the temperature and a relation between a difference Δf between the value of normalized f1 and the value of normalized f2 and the temperature.

FIG. 9 shows a relation between OSC1 and the temperature (which is the same as FIG. 8), and a relation between (OSC2−OSC1) and the temperature, in which it can be understood that (OSC2−OSC1) is in a linear relation with respect to the temperature. Therefore, it can be understood that (OSC2−OSC1) corresponds to the amount of deviation from the reference temperature due to the temperature variation. Further, generally, since it is said that the frequency-temperature characteristic of the quartz-crystal oscillator is represented by a cubic function, if a relation between a frequency compensation value that cancels an amount of frequency variation obtained by the cubic function and (OSC2−OSC1) is determined, the frequency compensation value is determined based on a detection value of (OSC2−OSC1).

Figure 10:
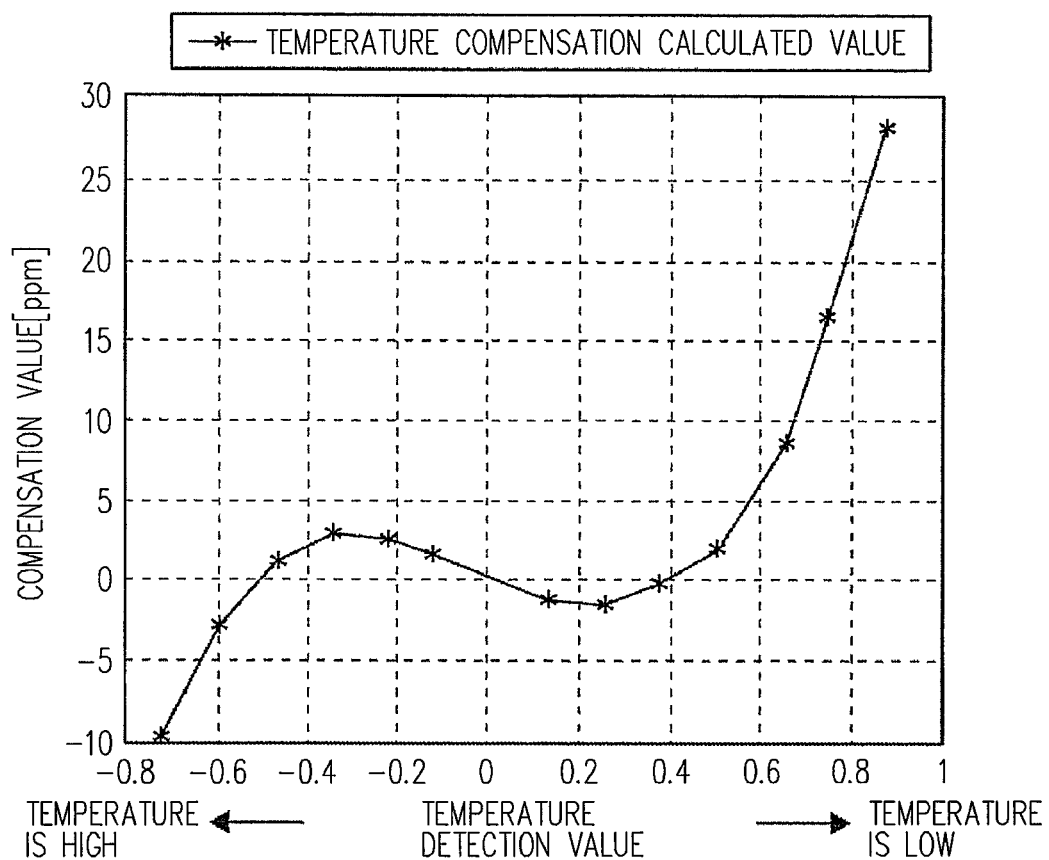
FIG. 10 is a characteristic diagram showing a relation between a value obtained by normalizing a vertical axis in FIG. 9 and a frequency compensation value.

As described above, the oscillation device of this embodiment uses the frequency signal obtained from the first oscillation circuit 1 (f1) as the reference clock of the control circuit unit 200 shown in FIG. 1, and the reference clock has the frequency-temperature characteristic, so that the temperature compensation is tried to be performed on the frequency of the reference clock. Accordingly, at first, a function representing a relation between the temperature and f1 normalized by the reference temperature is previously determined, and a function for cancelling the amount of frequency variation of f1 obtained by the function is determined as in FIG. 10. Therefore, a vertical axis in FIG. 10 is −OSC1. In this example, the aforementioned function is set to a ninth-order function, for example, in order to perform the temperature compensation with high accuracy.

As described above, since the temperature and (OSC2−OSC1) are in the linear relation, a horizontal axis in FIG. 10 is the value of (OSC2−OSC1), but if the value of (OSC2−OSC1) is used as it is, an amount of data for specifying the value becomes large, so that the value of (OSC2−OSC1) is normalized. As the normalization in this case, an upper limit temperature and a lower limit temperature under which the oscillation device will be actually used are set, and each value in a temperature range of the upper limit temperature to the lower limit temperature (OSC2−OSC1) is treated as a numerical value of a range from −1 to +1. More specifically, for example, in the aforementioned temperature range, it is assumed that an amount of frequency deviation (OSC2−OSC1) is varies in a range from −30 ppm to +30 ppm, and a value of a result of dividing (OSC2−OSC1) by −30 ppm is treated as a value of the aforementioned X. Specifically, in this example, as shown in FIG. 10, −30 ppm is set as +1, and +30 ppm is set as −1.

The frequency characteristic with respect to the temperature in the quartz-crystal oscillator is treated as a ninth-order polynomial approximate expression, in this example. Concretely, when producing the quartz-crystal oscillator, a relation between (OSC2−OSC1) and the temperature is obtained through actual measurement, and from the actual measurement data, a curve of compensation frequency indicating a relation between the temperature and −OSC1 cancelling an amount of frequency variation with respect to the temperature is derived, and coefficients of the ninth-order polynomial approximate expression are derived through a least square method. Further, the coefficients of the polynomial approximate expression are previously stored in the memory 30 (refer to FIG. 1), and the compensation value calculating unit 4 performs calculation processing of the following expression (1) by using these coefficients of the polynomial approximate expression.

$$Y=P9 \cdot X^9+P8 \cdot X^8+P7 \cdot X^7+P6 \cdot X^6+P5 \cdot X^5+P4 \cdot X^4+P3 \cdot X^3+P2 \cdot X^2+P1 \cdot X+P0 \quad (1)$$

In the expression (1), X indicates frequency difference detection information, Y indicates compensation data, and P0 to P9 indicate the coefficients of the polynomial approximate expression.

X will now be explained in detail. A relation X=x/k is satisfied, where x is a value obtained by the frequency difference detection unit 3 shown in FIG. 1 (i.e., a value obtained by the averaging circuit 37 shown in FIG. 2), that is a value of (OSC2−OSC1). k is a divide coefficient previously stored in the memory 30, and is a constant specific to a device. Thus, x is treated as a numerical value X normalized in the range from −1 to +1 as described previously by dividing by k. To explain this divide coefficient k more detail, it is assumed that the normalized X is varied in the range from −1 to +1, in a temperature range where an oscillation device is operated. However, if k is temporarily set as a uniform value in each device, a variation range of X may become very small compared with the range from −1 to +1 depending on a device, due to a variation in processing accuracy of the quartz-crystal oscillators 10 and 20, etc. If the coefficients P0 to P9 are set in the aforementioned expression (1) using X with such a small variation range as described later, the absolute value of the P0 to P9 becomes large, and thereby a capacity of the memory 30 also become large. Consequently, by computing X using the divide coefficient k as mentioned above, normalization of X is performed, and the variation range of X is brought close to the range from −1 to +1 assumed previously. An increase in the absolute value of the value of P can be reduced by setting the polynomial approximation coefficient P using the above X. In the aforementioned temperature range, a numerical value with a small absolute value is used as the divide coefficient k, as the variation range of (OSC2−OSC1) becomes small centering on 0.

Figure 11:
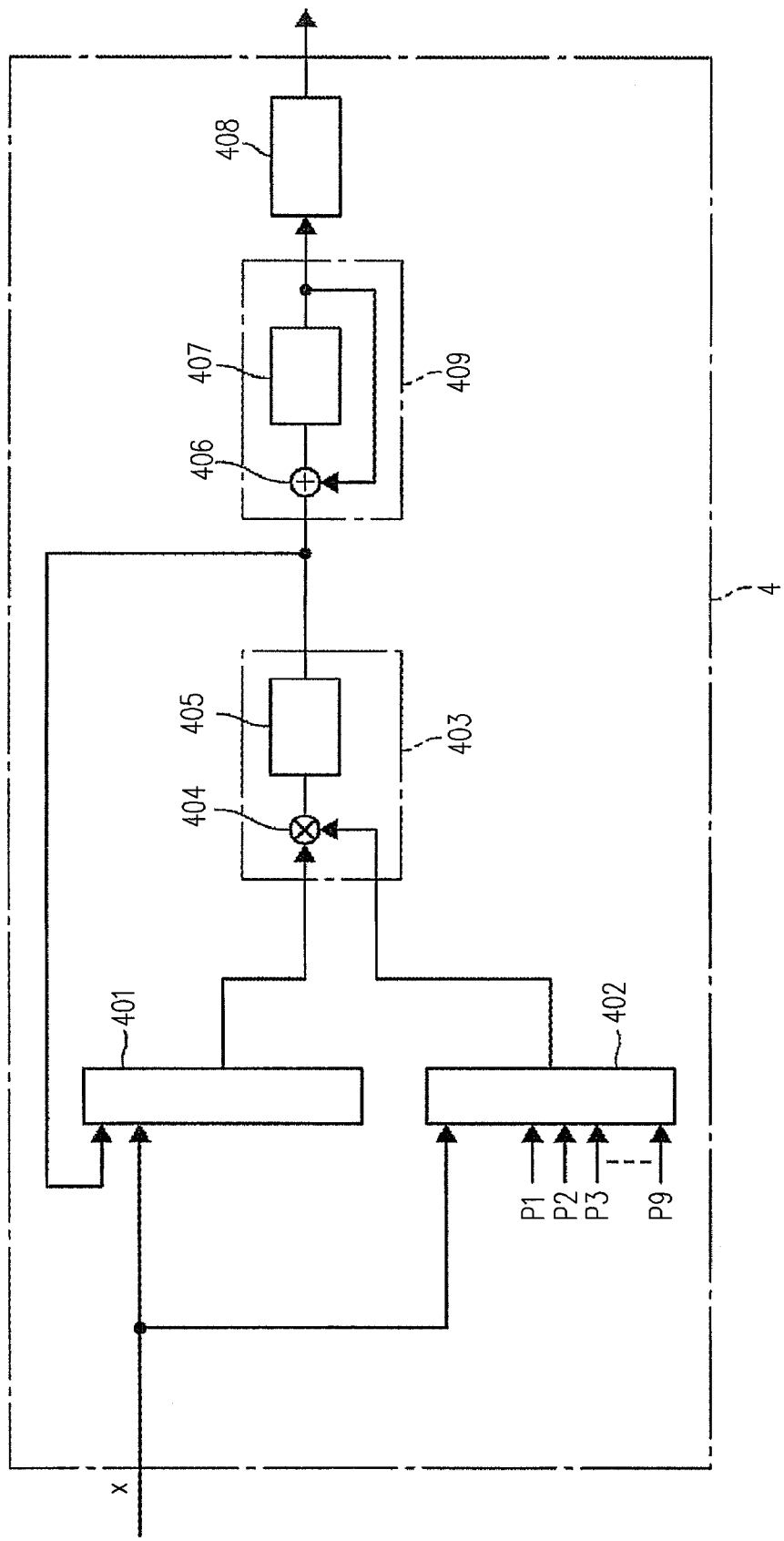
FIG. 11 is a block diagram showing a compensation value calculating unit.

Next, a structure of the compensation value calculating unit 4 will now be explained referring to FIG. 11. Reference numeral 401 denotes a first multiplexer and reference numeral 402 denotes a second multiplexer. The first and second multiplexers 401 and 402 are mutually connected to the frequency difference detection unit 3 at a previous stage side in parallel, and the aforementioned x is input thereto. The coefficients of the polynomial approximate expression of P1 to P9 are input into the second multiplexer 402 from the memory 30. A calculating section 403 is provided at a subsequent stage of the first and second multiplexers 401 and 402. The calculating section 403 is composed of a multiplication section 404 at a side of a previous stage, and a division section 405 at a side of a subsequent stage.

The division section 405 divides an output from the multiplication section 404 using the divide coefficient k stored in the memory 30, and normalizes the divided data as described above to output the normalized data to a subsequent stage. A subsequent stage of the division section 405 is connected to an adding section 406, and the first multiplexer 401 and the division section 405 are connected so that an output of the division section 405 is fed back to an input of the first multiplexer 401. A latch circuit 407 is provided at a subsequent stage of the adding section 406 so that an output of the adding section 406 is latched. A subsequent stage of the latch circuit 407 is connected to a circuit 408 executing a round processing, and the latch circuit 407 and the adding section 406 are connected so that an output of the latch circuit 407 is fed back to the adding section 406. The adding section 406 and the latch circuit 407 are named as an adding circuit 409 herein.

Processing steps of calculating each term of the approximate expression (1) by the compensation value calculating unit 4 will now be explained. The aforementioned x is output from the first multiplexer 401 and the coefficient P1 is output from the second multiplexer 402, and x×P1×1/k=P1·X is calculated by the calculating section 403, and a calculated result is output to the multiplexer 401. Further, x is output from each the multiplexer 401 and 402, and x×x×1/k is calculated by the calculating section 403. Subsequently, this calculated result is output from the first multiplexer 401 and the coefficient P2 is output from the second multiplexer 402, and the calculating section 403 calculates x×x×1/k×P2×1/k=P2·X²[X²=(1/k)²x²] and outputs a calculated result to the adding circuit 409. Furthermore, x and x×x×1/k are output respectively from the multiplexers 401 and 402, and then x³×(1/k)² is obtained. This calculated result is output from the multiplexer 401, P3 is output from the multiplexer 402, and then x³×(1/k)³×P3=P3×X³ is obtained. Thus, each term of the approximate expression (1) is calculated to be input into the adding circuit 409. Since normalization of x is executed by the division section 405 as described above, each term input into the adding circuit 409 in this way is the calculated value using normalized x. The total value (additional value) of the calculated value is output from the adding circuit 409, and the total value is rounded to be output by the circuit 408. Note that, the coefficient P0 is previously input into the adding section 406.

The arithmetic expression of compensation value is not limited to using the ninth-order polynomial approximate expression, but a polynomial approximate expression of order (e.g., fourth order or more) according to a required accuracy may be used. Note that, although X may be computed by calculating x/k at an inlet of the compensation value calculating unit 4 using the division section 405 to compute each term of the expression (1) using this X, if x/k is calculated firstly using in this way, X becomes an approximate value when x indivisible by k. Since calculation accuracy is reduced if the following calculation is executed using this approximate value, in this example, a structure in which the division is performed using the divide coefficient k after the multiplication section 404 performs the multiplication of x is adopted to compute the compensation value Y with sufficient accuracy.

A structure of a setting device for setting up the aforementioned divide coefficient k will now be explained referring FIG. 12. Reference numeral 101 in FIG. 12 denotes a container into which internal temperature thereof can be changed flexibility. More specifically, the container 101 is structured as a container utilizing a thermostatic oven or a Peltier device. One or more oscillation devices according to the present invention are contained in the inside of the container 101, for example, and each oscillation device is connected to a switching means 102 out of the container 101. The switching means 102 connects one of the oscillation devices in the container 101 to a frequency measuring means 103 composed of a frequency counter and a control means 106 alternately. In the oscillation device connected to the frequency measuring means 103 and the control means 106, the output frequency f1 from the first oscillation circuit 1 and the output frequency f2 from the second oscillation circuit 2 are measured, and then it becomes possible to write each coefficient in the memory 30.

Figure 12:
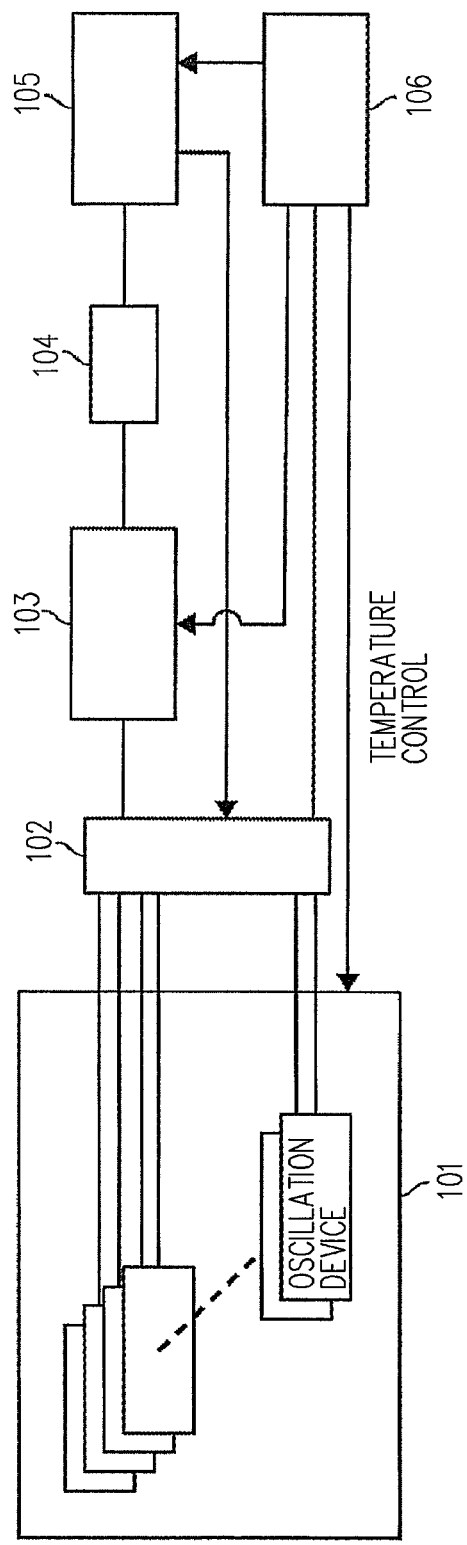
FIG. 12 is a block diagram showing an apparatus for manufacturing an oscillation device.

The measured output frequencies f1 and f2 from the first oscillation circuit 1 and the second oscillation circuit 2, OSC1, OSC2, and (OSC2−OSC1) etc. which are calculated is stored in a memory of 104 shown in FIG. 12. Ranges A1, A2, A3 . . . and An mutually different among a ranges (e.g., from 0 ppm to 30 ppm) adaptable for |OSC2−OSC1| and the coefficients k1, k2, k3, . . . and kn are associated with each other to be stored in the memory 104. Such coefficients k1 to kn are mutually different numerical values, and are the values which can be set as the divide coefficient k as described later. A correction value calculation means 105 computes the aforementioned compensation value Y based on OSC1, OSC2, and OSC2−OSC1 stored in the memory 104. The control means 106 controls temperature of the container 101, and operation of the switching means 102.

Setting step of the divide coefficient k by the aforementioned setting device will now be explained. Characteristics of the output frequencies f1 and f2 (unit of measure: Hz) with respect to temperature with regard to the oscillation device connected to the frequency measuring means 103 and the control means 106 are measured, changing temperature of the container 101 in a temperature range where the oscillation device is operated. Next, based on the characteristics of the obtained output frequencies f1 and f2, characteristics of OSC1 and OSC2 with respect to temperature (unit of measure: ppm) are calculated, and the characteristics of OSC2−OSC1 with respect to temperature are further calculated.

A maximum value of |OSC2−OSC1| is detected based on the characteristics of OSC2−OSC1 with respect to the obtained temperature. Next, a range A within which this detected maximum value falls is specified based on the aforementioned ranges from A1 to An stored in the memory 104, and a coefficient to A specified from among the coefficients k1 to kn is determined as the divide coefficient k. Next, the polynomial approximation coefficients P0 to P9 are determined based on the divide coefficient k and the characteristics of OSC2−OSC1 with respect to the temperature, and the determined divide coefficient k and polynomial approximation coefficients P0 to P9 are written in the memory 30 of the oscillation device. After the writing processing is completed, other oscillation devices are connected to the frequency measuring means 103 and the control means 106, and then the divide coefficient k and the polynomial approximation coefficients P0 to P9 are set to be written in the memory 30 similarly, by other switching means. A series of above operations are executed by the control means 106. Further, since OSC1 and OSC2 become a value specific to the quartz-crystal oscillator which structures an oscillation device, a suitable divide coefficient k is set for every device.

Next, the entire operation of the aforementioned embodiment will be summarized. The frequency signal output from the first oscillation circuit 1 is supplied as the clock signal to the control circuit unit 200 for controlling the voltage controlled oscillator 100, and, as described in the beginning of the present embodiment, the frequency signal with the intended frequency is output from the voltage controlled oscillator 100 through the control operation in the control circuit unit 200. Meanwhile, the frequency signals f1, f2 respectively output from the first oscillation circuit 1 and the second oscillation circuit 2 are input into the frequency difference detecting unit 3, and, through the operation which has been already described in detail, the PLL is locked when the output of the PLL being the output of the frequency difference detecting unit 3 takes the value corresponding to $\{\Delta fr - (f2 - f1)\}$ in this example, which is the value of (OSC2−OSC1) in this example. Further, the value is input into the compensation value calculating unit 4, and the calculation in the expression (1) is executed, resulting in that an amount of frequency compensation being temperature compensation data is obtained. The calculation in the expression (1) is a processing for determining, in the characteristic diagram shown in FIG. 10, the value on the vertical axis of the curve of compensation frequency corresponding to the value obtained based on the output value of the frequency difference detecting unit 3, for example.

As shown in FIG. 1, the first quartz-crystal oscillator 10 and the second quartz-crystal oscillator 20 are structured by using the common quartz-crystal piece Xb, and are thermally coupled to each other, so that the frequency difference between the oscillation circuits 1 and 2 takes a value which corresponds to the ambient temperature quite accurately, and accordingly, the output of the frequency difference detecting unit 3 is temperature difference information between the ambient temperature and the reference temperature (25° C., in this example). The frequency signal f1 output from the first oscillation circuit 1 is used as the main clock of the control circuit unit 200, so that the compensation value obtained by the compensation value calculating unit 4 is used as a signal for compensating the operation of the control circuit unit 200 for cancelling the influence on the operation of the control circuit unit 200 based on the amount of frequency deviation of f1 due to the deviation of temperature from 25° C. As a result of this, the output frequency of the voltage controlled oscillator 100 being the output of the oscillation device of the present embodiment becomes stable regardless of the temperature variation.

According to the above-mentioned embodiment, the approximate expression (1) for calculating the compensation value of OSC1 is calculated using x corresponding to an output of OSC2−OSC1 output from the frequency difference detection unit 3, the divide coefficient k specific to the device, and the polynomial approximation coefficient P. Therefore, even if ranges in which the value x of OSC2−OSC1 normalized for every device is varied are different, an absolute value of x/k=X of the approximate expression (1) can be brought close to 1. Accordingly, it can avoid the absolute value of the polynomial approximation coefficients P0 to P9 becoming large, resulting from that it is avoiding the involution value of X becoming extremely small. Therefore, a capacity of the memory 30 required for storing the polynomial approximation coefficient P can be reduced. By the way, although the amount of frequency deviation (OSC2−OSC1) is varied with a cutting angle of the quartz-crystal piece which structures the first and second quartz-crystal oscillators, electrode layers thickness, an electrode area, etc., adjusting the above conditions to be adjusted to a range from −30 ppm to +30 ppm assuming the amount of frequency deviation requires time and effort. In particular, since the first and second quartz-crystal oscillators 10 and 20 are structured of the common quartz-crystal piece Xb in the aforementioned embodiment, it is difficult to adjust so that OSC2−OSC1 may be varied in a desired range. Therefore, it is effective to set up the divide coefficient k as mentioned above.

Although the description is repeated, in this embodiment, the value corresponding to the difference between f1 and f1$r$ is {(f1−f1$r$)/f1$r$} OSC1), the value corresponding to the difference between f2 and f2$r$ is {(f2−f2$r$)/f2$r$} (=OSC2), and the value corresponding to the difference value between the value corresponding to the difference between f1 and f1$r$ and the value corresponding to the difference between f2 and f2$r$ is OSC2−OSC1. However, the frequency difference detecting unit 3 may also use the difference value between (f1−f1$r$) and (f2−f2$r$) itself, as the value corresponding to the difference value between the value corresponding to the difference between f1 and f1$r$ and the value corresponding to the difference between f2 and f2$r$, and in this case, the graph in FIG. 7 is utilized to determine the temperature.

In the aforementioned embodiment, in the explanation from FIG. 8 to FIG. 10, the amount of change in the frequency is displayed in the unit of "ppm", but it is all treated as a binary number in an actual digital circuit, so that a frequency setting accuracy of the DDS circuit section 36 is calculated by the number of configuration bits, for example, 34 bits. There can be cited an example as follows, in which a clock of 10 MHz is supplied to the DDS circuit section 201 included in the control circuit unit 200 shown in FIG. 1, a variable frequency of the clock being 100 Hz.

[Variable Ratio Calculation]

$$100 \text{ Hz}/10 \text{ MHz}=0.00001$$

[ppm Conversion]

$$0.00001*1e6=10 \text{ [ppm]}$$

[DDS Setting Accuracy Conversion]

$$0.00001*2^{\wedge}34 \approx 171.799 \text{ [ratio-34 bit (tentative name)]}$$

In the above-described structure, the frequency setting accuracy can be represented by the following expression (2).

$$1*[\text{ratio-34 bit}]=10 \, M \, [\text{Hz}]/2^{\wedge}34 \approx 0.58 \, m \, [\text{Hz/bit}] \quad (2)$$

Therefore, the expression of 100 [Hz]/0.58 m [Hz/bit] ≈171.799 [bit (ratio-34 bit)] is satisfied.

Further, 0.58 mHz can be calculated by the following expression (3), with respect to 10 MHz.

$$0.58 \, m \, [\text{Hz}]/10 \, M \, [\text{Hz}]*1e9 \approx 0.058 \, [\text{ppb}] \quad (3)$$

Therefore, from the expressions (2), (3), a relation of expression (4) is satisfied.

$$1e9/2^{\wedge}34=0.058 \, [\text{ppb/ratio-34 bit}] \quad (4)$$

Specifically, the frequency processed in the DDS circuit 36 is eliminated, and a relation with only the number of bits is satisfied.

Furthermore, in the aforementioned example, the first quartz-crystal oscillator 10 and the second quartz-crystal oscillator 20 use the common quartz-crystal piece Xb, but, it is also possible that the quartz-crystal piece Xb is not used in a shared manner. In this case, there can be cited an example in which the first quartz-crystal oscillator 10 and the second quartz-crystal oscillator 20 are disposed in a common casing, for example. With such structure, since both the oscillators are placed under substantially the same temperature environment, it is possible to achieve the similar effect.

The output signal of the DDS circuit section 36 of the frequency difference detecting unit 3 is not limited to the saw-tooth wave, and it is only required to be a frequency signal whose signal value repeatedly increases and decreases with time such as, for example, a sine wave.

Further, the frequency difference detecting unit 3 may also be structured to count f1 and f2 by using a counter, subtract a value corresponding to Δfr from a difference value between the count values, and output a value corresponding to the obtained count value.

Figure 19:
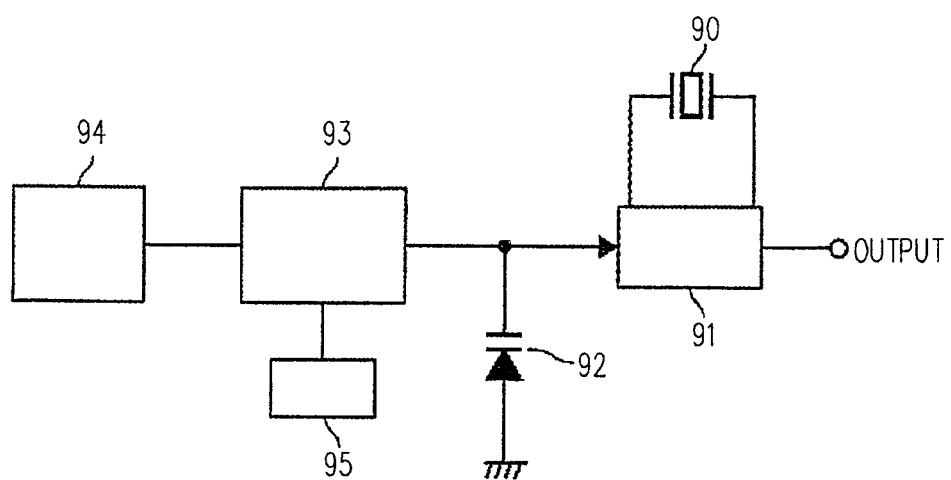
FIG. 19 is a structural diagram showing a conventional TCXO.

The compensation value calculated by the compensation value calculating unit 4 is not limited to using as an above-mentioned embodiment. When the output frequency of the oscillation device is varied dependent on temperature, it is possible to perform the compensation using other methods, as long as even a structure in which the compensation is possible so that the amount of variation of the output frequency can be canceled using the compensation value is adopted. For example, in the TCXO shown in FIG. 19, it is also possible that the frequency difference information obtained by the frequency difference detecting unit 3, instead of the output of the temperature detector 94, is used, an amount of compensation of the control voltage comparable to the amount of frequency compensation is determined based on the information, and the amount of compensation and the reference voltage for outputting the frequency at the reference temperature are added in the control voltage generating unit 93 to set it to the control voltage. The method of determining the amount of frequency compensation from the frequency difference information is not limited to the use of polynomial approximate expression as in the aforementioned embodiment, and it may also be a method in which a table representing a relation between the frequency difference information and the amount of frequency compensation is previously stored in the memory, and the table is referred to.

In the above-described embodiment, the frequency difference between the first quartz-crystal oscillator 10 and the second quartz-crystal oscillator 20 is used as a sort of temperature measurement value, and based on the temperature measurement value, the frequency compensation value with respect to the temperature variation of the first quartz-crystal oscillator 10 is determined. However, also when the present invention adopts a structure in which a quartz-crystal oscillator to be a target of frequency compensation and one of the two quartz-crystal oscillators that form a sort of thermometer are not made common, it falls within the technical scope of claims.

It can be said that the compensation value obtaining unit in this case obtains, based on the value corresponding to the difference value detected by the frequency difference detecting unit and a relation between the value corresponding to the difference value and a frequency compensation value of an oscillation frequency f0 of another oscillation circuit for oscillating another quartz-crystal oscillator different from the first quartz-crystal oscillator and the second quartz-crystal oscillator, the frequency compensation value of f0, instead of obtaining, based on the value corresponding to the difference value detected by the frequency difference detecting unit and the relation between the value corresponding to the difference value and the frequency compensation value of the oscillation frequency f1 of the first oscillation circuit, the frequency compensation value of f1.

(Reference Test 1)

Figure 13:
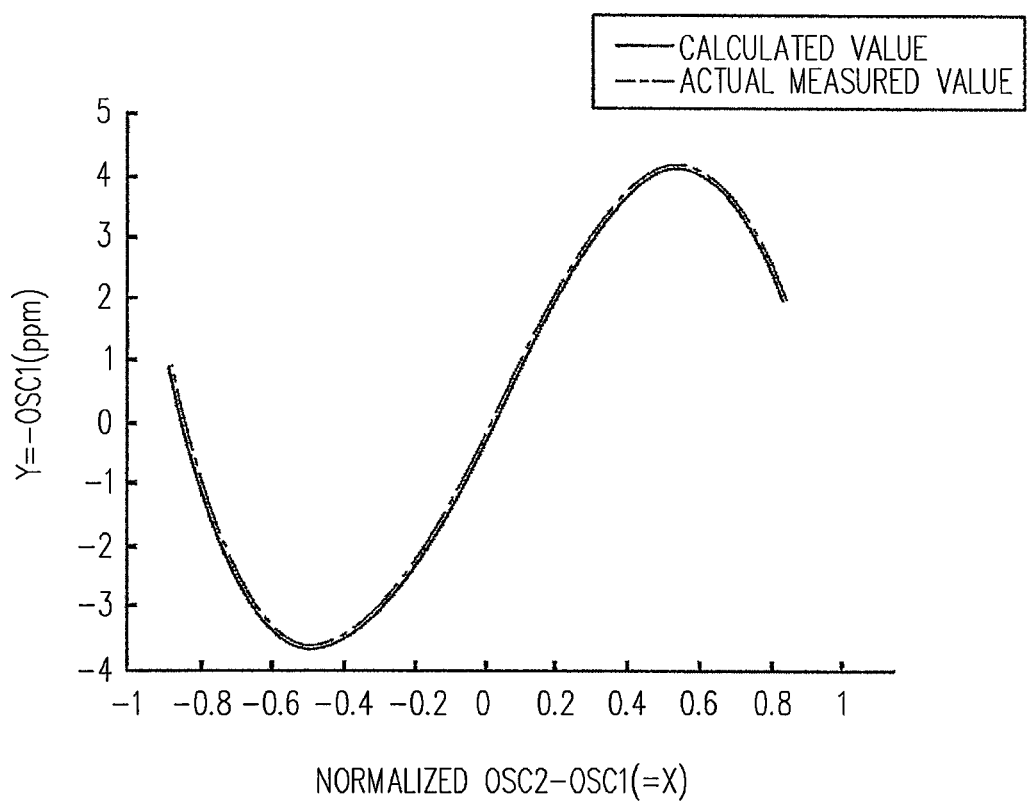
FIG. 13 is a graph chart showing a variation of a frequency deviation with respect to temperature.

A reference test relevant to the present invention will now be explained below. In the aforementioned embodiment, since OSC2−OSC1 is normalized in a range from −1 to +1, a validity of the normalizing in this manner will now be explained. However, in each following examination, the divide coefficient k is not set as a constant specific to a device, and the polynomial approximation coefficients P0 to P9 are set as X=normalized OSC2−OSC1, unless in particular otherwise described. A graph of the approximate expression (1) in which the aforementioned polynomial approximation coefficients P0 to P9 are set up to be normalized in this manner is shown in FIG. 13 with a solid line, in the oscillation device as stated above. The horizontal axis of the graph indicates normalized OSC2−OSC1. The vertical axis of the graph indicates Y=−OSC1 (unit of measure: ppm) of the approximate expression (1). A dashed line of the graph in FIG. 13 indicates a relation between normalized OSC2−OSC1 and actually measured −OSC1. The solid line and the dashed line overlap with each other actually, but are shifted mutually upward and downward in some degree for better viewability in the graph of FIG. 13.

Figure 14:
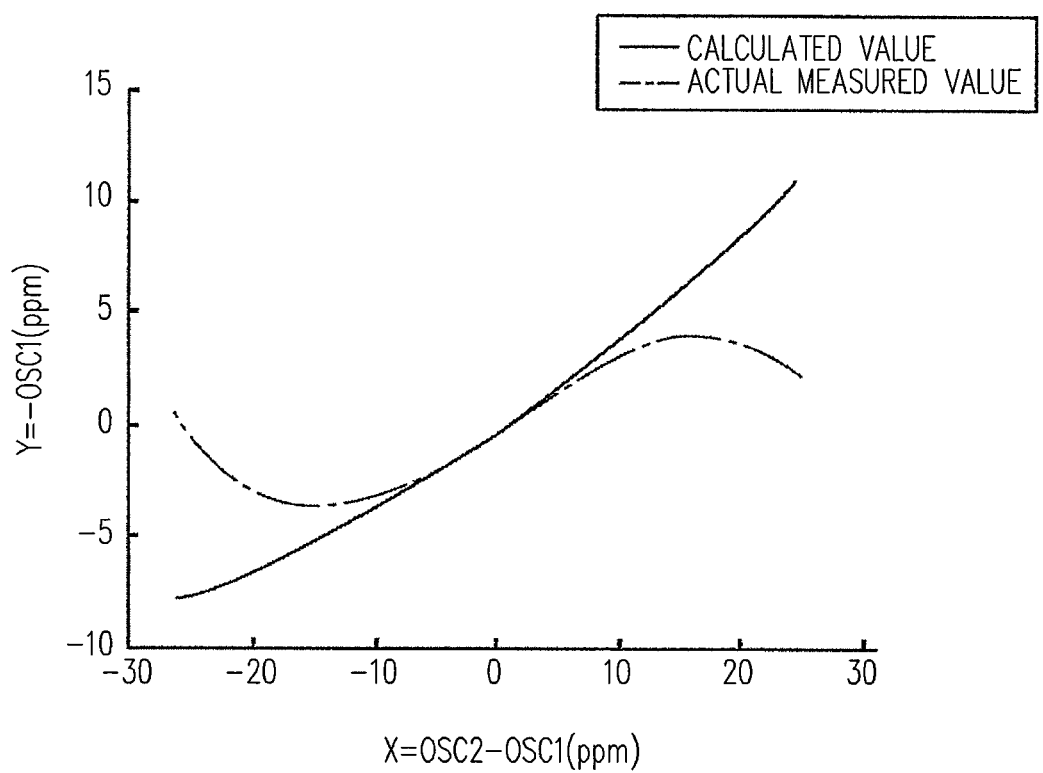
FIG. 14 is a graph chart showing a variation of a frequency deviation with respect to temperature.

A graph of the approximate expression (1) in which the polynomial approximation coefficients P0 to P9 is set without normalizing of OSC2−OSC1 is shown in FIG. 14 as a solid line. The horizontal axis of the graph is OSC2−OSC1 (unit of measure: ppm). The vertical axis of the graph is Y=−OSC1 in the same manner as for FIG. 13. A dashed line indicating a relation between actually measured −OSC1 and (OSC2−OSC1) is also shown in the graph of FIG. 14. Thus, a correlation between −OSC1 calculated with the approximate expression (1) and the actual measured value of −OSC1 is low in the case of not performing the normalization as shown in FIG. 14, compared with the case of performing the normalization as shown in FIG. 13.

The reason the correlation between −OSC1 calculated with the approximate expression (1) and the actual measured value of −OSC1 becomes low in the case of not performing the normalization is the following. Since, as the value of OSC2−OSC1 indicated in the horizontal axis of the graph shown in FIG. 14 becomes larger than 1, the value of r (n is 9 to 1) of the approximate expression (1) also becomes larger according to an order of the exponentiation, it becomes impossible to obtain a desired compensation value unless the values of P0 to P9 is set to a small value. Meanwhile, in order to execute calculation of compensation value by digital processing, since the calculation of the compensation value is executed for an integer which is generally easy to process, it is necessary to set the coefficient after the decimal point to zero (0).

The more the order of the exponentiation of $X^n$ (n is 9 to 1) is large, the more the corresponding value of Pn (n is 9 to 1) must also be made small. As a consequence, a term of high order becomes zero (0) easily by setting the value to an integer, and therefore the calculated result only corresponding to a low order term appears as shown in FIG. 14. Therefore, it is effective to set the polynomial approximation coefficients P0 to P9 with the aforementioned normalization.

(Reference Test 2)

Although the polynomial approximation coefficient is computed for the actual measured data of the frequency-temperature characteristic as mentioned above, since an measurement error may be included in the actual measured data, even when the frequency-temperature characteristic of the same quartz-crystal oscillator is obtained several times, for example, the same approximation coefficients P0 to P9 are not necessarily obtained each time. Therefore, an error of the approximation coefficient will influence on correction accuracy of the frequency of the device. Consequently, this reference test 2 was performed in order to verify how an amount of deviations (error amount) of the actual measured data, when the set approximation coefficient is shifted from an original approximation coefficient under an influence of the measurement error etc., is changed due to the normalization.

A difference (i.e., an amount of compensation error (unit of measure: ppb)) between actually measured −OSC1 of devices with which the maximum values of OSC2−OSC1 are different from each other in a predetermined temperature range and −OSC1 calculated using the approximate expression (1) set as a value to which +1 is added to a computed value of P9 was measured. OSC2−OSC1 is normalized in the range from −30 ppm to +30 ppm so that X is set to be within a range from −1 to +1, in the same manner as for the aforementioned embodiment. Since an influence of the deviation of the approximation coefficient becomes large in the approximate expression (1) as a term of high order, settings of P9 among P0 to P9 are changed, and therefore the aforementioned amount of deviations became clear by changing P9 in this manner.

Figure 15A:
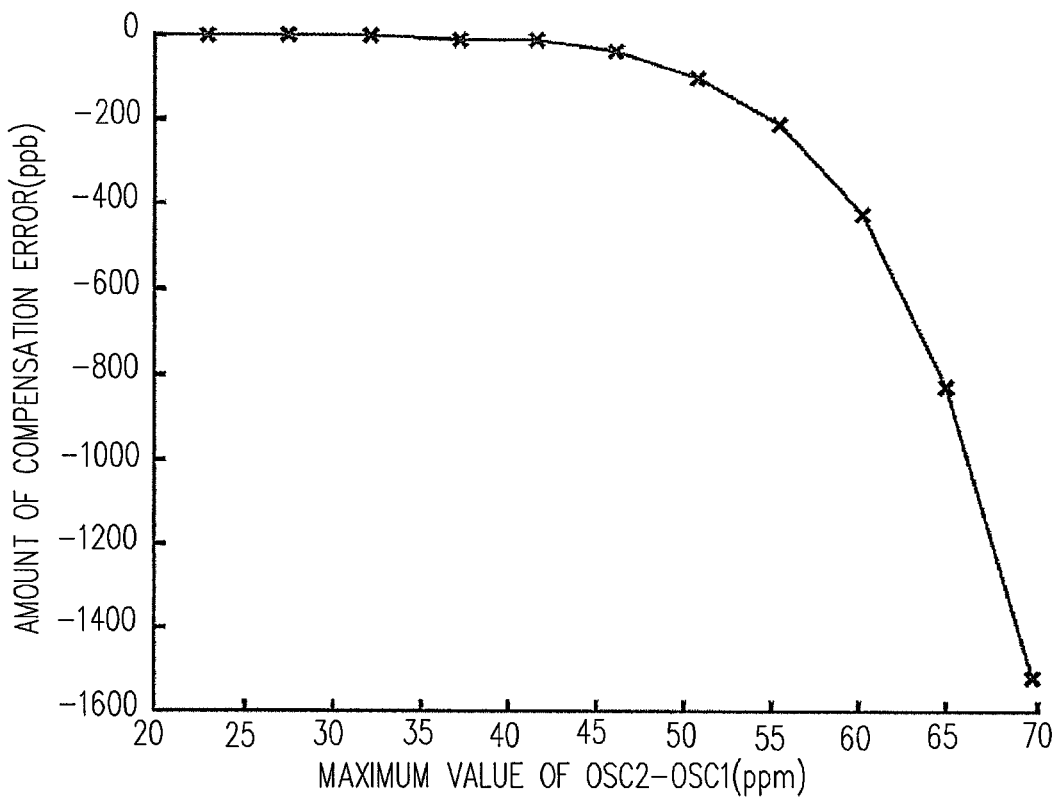
FIGS. 15(a) and 15(b) are graph charts showing respective relations between error amounts of compensation value for every apparatus.
Figure 15B:
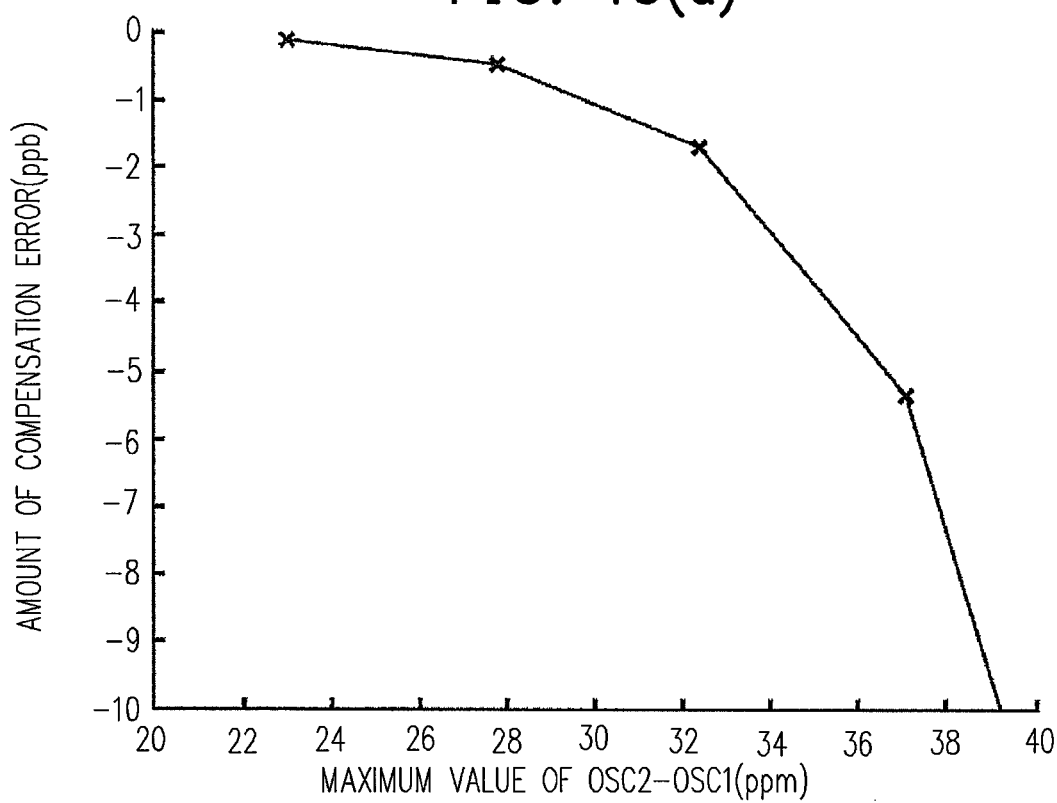

The horizontal axis of a graph shown in FIG. 15(a) indicates the maximum value of OSC2−OSC1 for every device, and the vertical axis thereof indicates the aforementioned amount of compensation error. FIG. 15(b) is a graph showing near OSC2−OSC1=30 ppm in detail in the graph shown in FIG. 15(a). As shown in FIG. 15 (b), when OSC2−OSC1 exceeds 30 ppm, an amount of compensation error becomes large rapidly. Thus, the reason OSC2−OSC1 is changed can be explained as follows. If OSC2−OSC1 is not more than 30 ppm, since an absolute value after normalization of OSC2−OSC1 becomes a value not larger than 1, the absolute value of the calculated value of $X^9$ included in the approximate expression (1) becomes a value not larger than 1. However, since the value after normalization of OSC2−OSC1 becomes a value larger than 1 if OSC2−OSC1 exceeds 30 ppm, the calculated value of $X^9$ will increase exponentially due to the increase in OSC2−OSC1. That is, the calculated value also changed largely even when the value of P9 is merely shifted within +1, and it is proved that an error actually becomes large as a result of this experiment. Therefore, in order to reduce the amount of compensation error, it is effective to set so that a range from which OSC2−OSC1 is actually changed may not exceed a range to be normalized, i.e., to set using the maximum value of OSC2−OSC1.

(Reference Test 3)

Figure 16A:
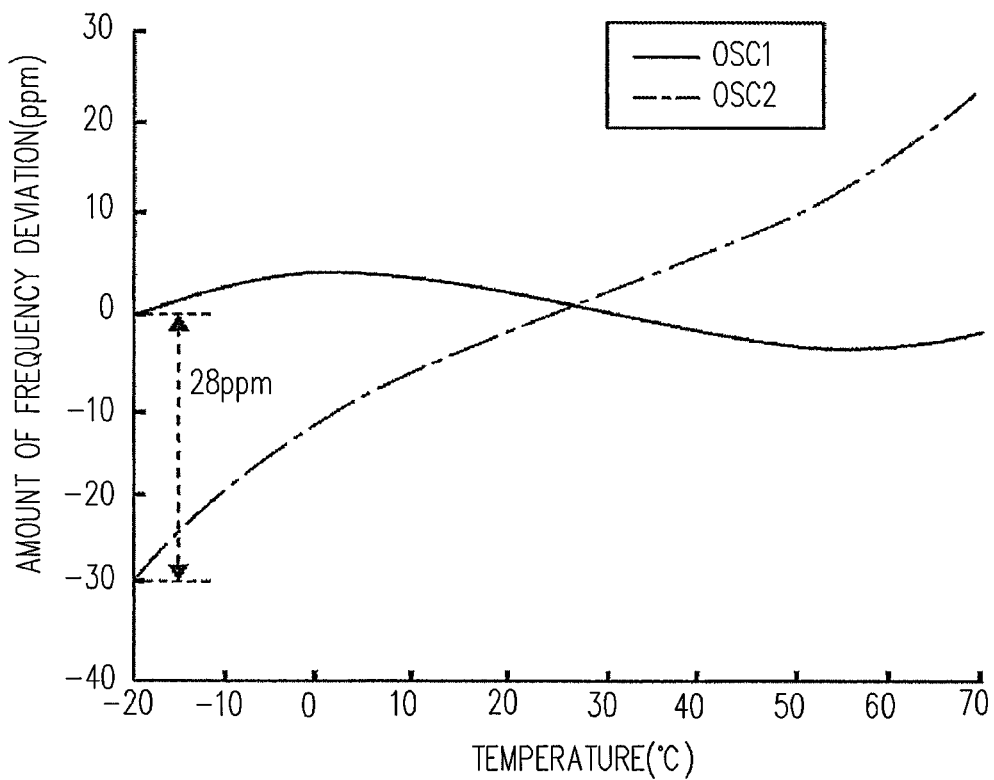
FIGS. 16(a) and 16(b) are graph charts showing respective variations of a frequency deviation with respect to temperature.
Figure 16B:
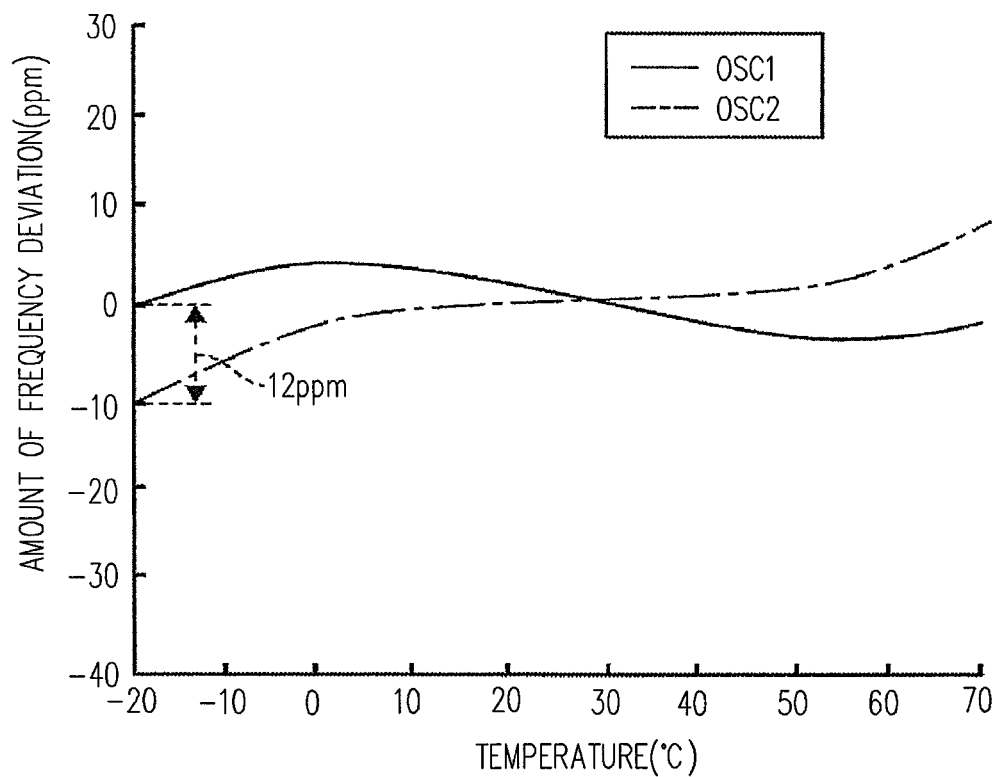
Figure 17A:
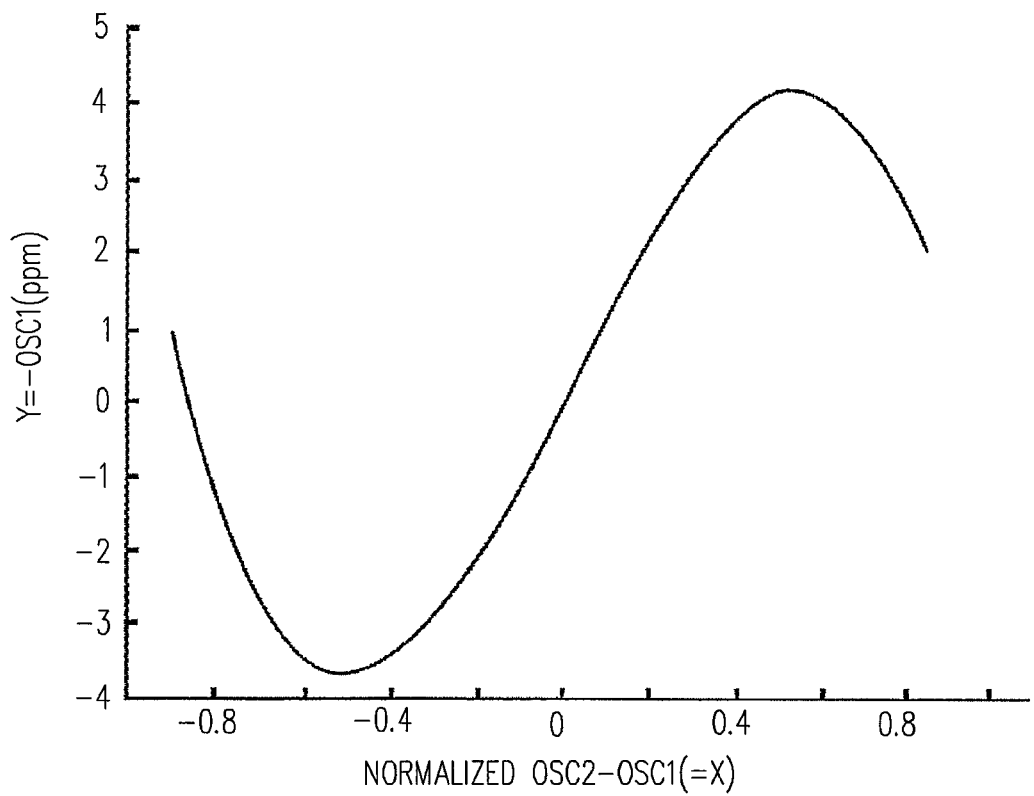
FIGS. 17(a) and 17(b) are graph charts showing respective variations of a frequency deviation with respect to temperature.
Figure 17B:
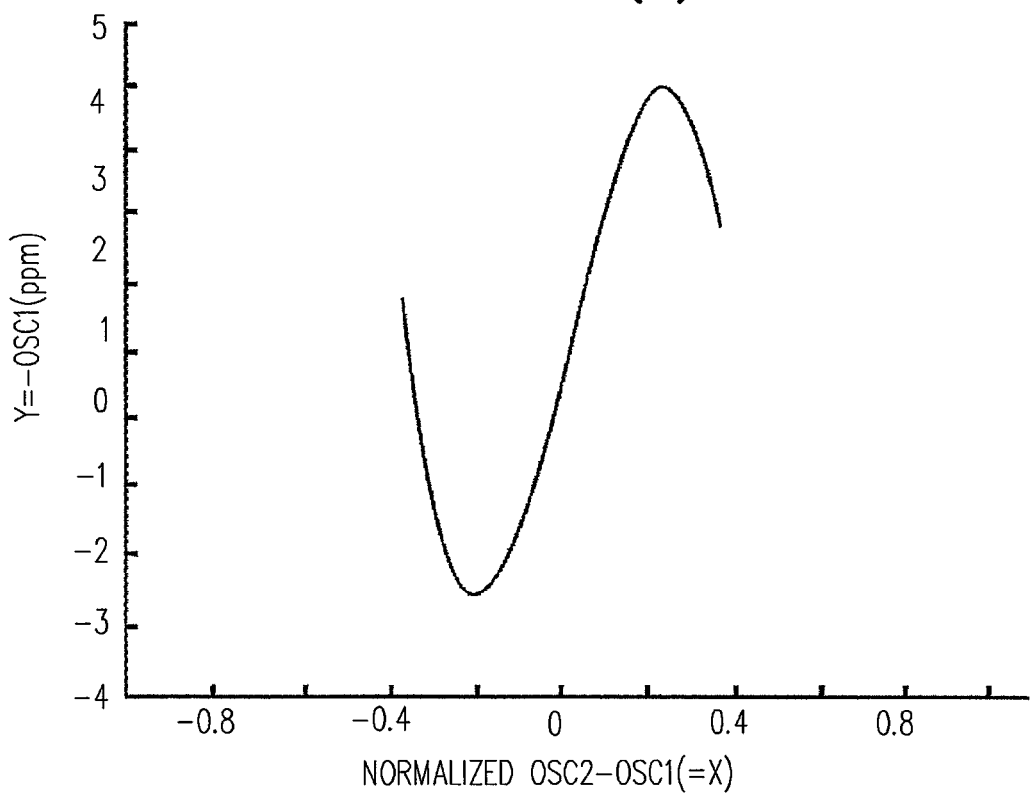

Although it is assumed that OSC2−OSC1 is varied within the range from −30 ppm to +30 ppm as mentioned above, FIG. 16(a) shows characteristics of OSC1 and OSC2 with respect to temperature of a device being within a range from −28 ppm to +28 ppm as a variation range of OSC2 −OSC1 assumed substantially. FIG. 16(b) shows the characteristics of OSC1 and OSC2 with respect to temperature of the device being within a range from −12 ppm to +12 ppm as the variation range of OSC2−OSC1 is largely less than the assumed range. A graph shown in FIG. 17(a) shows the characteristics of the approximate expression (1) obtained from OSC1 and OSC2 of FIG. 16(a). The horizontal axis of the graph indicates normalized OSC2−OSC1=X, and the vertical axis indicates Y=−OSC1 (unit of measure: ppm). The graph of FIG. 17(b) shows the characteristics of the approximate expression (1) obtained from OSC1 and OSC2 of FIG. 16(b). The vertical axis and horizontal axis of the graph of FIG. 17(b) are the same as that of the graph of FIG. 17(a).

The polynomial approximation coefficients P9, P8, P7, P6, P5, P4, P3, P2, P1, and P0 of the graph of FIG. 17(a) are respectively −9015, −2369, 16128, 4850, −9461, −3392, −12488, 2386, 11257, and −244. Meanwhile, the polynomial approximation coefficient P9, P8, P7, P6, P5, P4, P3, P2, P1, and P0 of the graph of FIG. 17(b) are respectively −25644683, −5272937, 7770083, 1534404, −778158, −155195, −172031, 14684, 27014, and −247. Thus, the absolute values of the polynomial approximation coefficients P1 to P9 of the graph of FIG. 17(b) are respectively greater than the absolute values of the polynomial approximation coefficients P1 to P9 of the graph of FIG. 17(a). Therefore, it is effective to set the divide coefficient k so that X may be widely distributed over the range from −1 to +1 as the aforementioned embodiment, and to set each coefficient of the approximate expression (1) as X=x/k.

(Reference Test 4)

Figure 18:
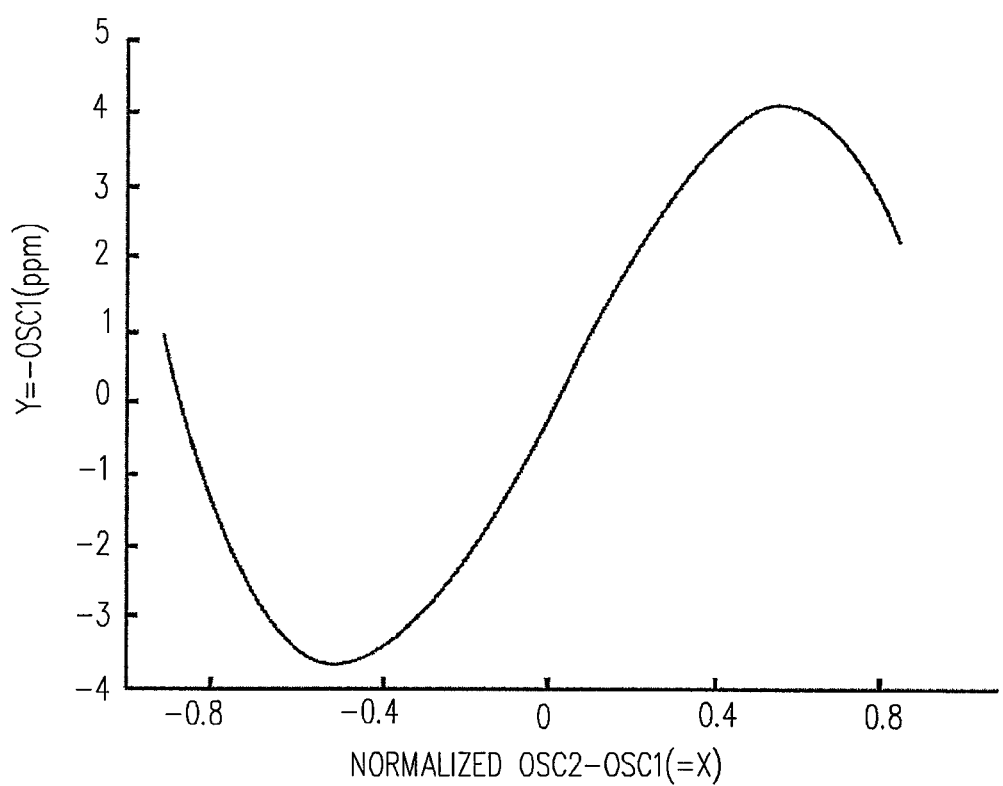
FIG. 18 is a graph chart showing a variation of a frequency deviation with respect to temperature.

FIG. 18 shows a graph showing characteristics of the approximate expression (1) obtained by normalizing OSC2−OSC1 of the device having the characteristics of FIG. 17(b) in a range from −12 ppm to +12 ppm, instead of the range from −30 ppm to +30 ppm. Specifically, it is treated as X=+1 where OSC2−OSC1=−12 ppm, and is treated as X=−1 where OSC2−OSC1=+12 ppm. In this graph, each polynomial approximation coefficient P9, P8, P7, P6, P5, P4, P3, P2, P1, and P0 is −6723, −3456, 12731, 6285, −7968, −3973, −11010, 2379, 10806, and −247, and is smaller than each numerical value normalized in the range from −30 ppm to +30 ppm. Thus, the rise of the absolute value of the polynomial approximation coefficient P can be reduced, by changing the setting of the range of OSC2−OSC1 normalized for every device, as shown in the above-described experiment. However, since a circuit which structures the device must be designed individually, time and effort and cost will be increased. Therefore, it is effective to set each coefficient of the approximate expression (1) as X=x/k, as the aforementioned embodiment.

What is claimed is:

1. An oscillation device, compensating a setting signal for setting an output frequency based on a detection result of an ambient temperature, the oscillation device comprising:
  a first quartz-crystal oscillator, structured by providing first electrodes on a quartz-crystal piece;
  a second quartz-crystal oscillator, structured by providing second electrodes on a quartz-crystal piece;
  a first oscillation circuit and a second oscillation circuit, connected to the first quartz-crystal oscillator and the second quartz-crystal oscillator respectively;
  a frequency difference detecting unit, when an oscillation frequency of the first oscillation circuit is set to f1, an oscillation frequency of the first oscillation circuit at a reference temperature is set to f1r, an oscillation frequency of the second oscillation circuit is set to f2, and an oscillation frequency of the second oscillation circuit at the reference temperature is set to f2r, the frequency difference detecting unit determines a difference corresponding value x which is corresponding to a difference value between a value corresponding to a difference between f1 and f1r, and a value corresponding to a difference between f2 and f2r; and
  a compensation value obtaining unit, obtaining a frequency compensation value of f1 resulting from the ambient temperature being different from the reference temperature based on the difference corresponding value x detected in the frequency difference detection unit, wherein
  the compensation value obtaining unit is structured to include a function for calculating the frequency compensation value of f1 for X, and X is a value corresponding to x/k by calculating an $n^{th}$-order polynomial, n is not less than 4, where k is a divide coefficient specific to a device introduced in order to set a coefficient of the polynomial to small value;
  the divide coefficient k is a value previously set according to a maximum value of the difference corresponding value x previously detected in a measurement temperature range;
  an output of the oscillation device is structured to be generated by utilizing an output of the first oscillation circuit; and
  the setting signal is structured to be compensated based on the frequency compensation value determined by the compensation value obtaining unit.

2. The oscillation device according to claim 1, wherein the compensation value obtaining unit comprises:
  a multiplication section;
  a division section, dividing an output from the multiplication section by the divide coefficient k;
  an integration section, integrating an output from the division section one by one to the constant of the polynomial;
  a first switching section, switching between the difference corresponding value x and the output from the division section to be output to the multiplication section; and
  a second switching section, switching between the difference corresponding value x and the coefficient in each order of the polynomial to be output to the multiplication section, wherein
  the compensation value obtaining unit is structured to multiply the values from both switching sections by the switching of the first switching section and the second switching section, and to output a calculated value of the polynomial from an adding section.

* * * * *